(12) United States Patent
Cheng

(10) Patent No.: US 12,376,504 B2
(45) Date of Patent: Jul. 29, 2025

(54) EMBEDDED BACKSIDE PCRAM DEVICE STRUCTURE

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 667 days.

(21) Appl. No.: 17/461,548

(22) Filed: Aug. 30, 2021

(65) Prior Publication Data
US 2023/0068754 A1    Mar. 2, 2023

(51) Int. Cl.
| H10N 70/20 | (2023.01) |
| G11C 13/00 | (2006.01) |
| H10B 63/00 | (2023.01) |
| H10N 70/00 | (2023.01) |

(52) U.S. Cl.
CPC ....... *H10N 70/253* (2023.02); *G11C 13/0004* (2013.01); *H10B 63/30* (2023.02); *H10N 70/021* (2023.02); *H10N 70/231* (2023.02)

(58) Field of Classification Search
CPC .. H10N 70/253; H10N 70/231; H10N 70/021; H10B 63/30; G11C 13/0004
See application file for complete search history.

(56) References Cited

U.S. PATENT DOCUMENTS

| 10,079,301 | B2* | 9/2018 | Han | H01L 29/7841 |
| 2008/0277642 | A1* | 11/2008 | In T Zandt | H10N 70/884 438/102 |
| 2011/0101298 | A1* | 5/2011 | Tang | H10B 63/845 257/E47.001 |
| 2012/0267595 | A1* | 10/2012 | Fang | H10N 70/061 257/E45.001 |
| 2013/0043455 | A1* | 2/2013 | Bateman | H10N 70/823 257/5 |
| 2013/0200331 | A1* | 8/2013 | Morikawa | H10N 70/826 257/5 |
| 2019/0157420 | A1* | 5/2019 | Cheng | H01L 29/0673 |
| 2019/0181224 | A1* | 6/2019 | Zhang | H01L 29/66553 |
| 2020/0235110 | A1* | 7/2020 | Morris | H01L 29/78642 |
| 2020/0251160 | A1* | 8/2020 | Sharma | H10B 12/315 |
| 2021/0066582 | A1* | 3/2021 | Lee | H10N 70/8828 |
| 2021/0296396 | A1* | 9/2021 | Wu | H10N 70/011 |
| 2022/0052115 | A1* | 2/2022 | Wang | H10B 63/34 |
| 2022/0415967 | A1* | 12/2022 | Barraud | G11C 5/063 |
| 2023/0029141 | A1* | 1/2023 | Cheng | H10B 63/30 |
| 2024/0074333 | A1* | 2/2024 | Radens | H10N 70/823 |

* cited by examiner

*Primary Examiner* — Douglas King
(74) *Attorney, Agent, or Firm* — Seed IP Law Group

(57) ABSTRACT

An integrated circuit includes a first chip bonded to a second chip. The first chip includes an array of memory cells. Each memory cell includes a transistor and phase change memory element. The transistor is between the phase change memory element and the second chip.

20 Claims, 19 Drawing Sheets

EMBEDDED BACKSIDE PCRAM DEVICE STRUCTURE

BACKGROUND

Technical Field

The present disclosure relates to the field of integrated circuits. The present disclosure relates more particularly integrated circuits including memory arrays.

Description of the Related Art

There has been a continuous demand for increasing computing power in electronic devices including smart phones, tablets, desktop computers, laptop computers and many other kinds of electronic devices. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. These techniques can form very small features. However, these techniques also face serious difficulties in ensuring that the features are properly formed.

Many integrated circuits include memory arrays. The reduction in the size of integrated circuit features extends to the memory cells of the memory arrays. However, it can be difficult to form effective memory cells at smaller and smaller technology nodes.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
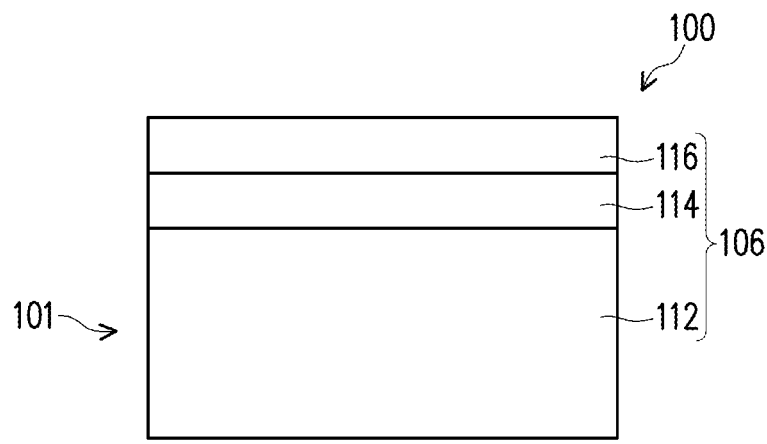
FIGS. 1A-1K are cross-sectional views of an integrated circuit including a phase change random access memory cell at various stages of processing, according to some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide phase change random access memory (PCRAM) cells formed in a first wafer. Each cell includes a transistor and a phase change memory element. The transistor is a gate all around nanosheet transistor. The phase change memory element includes similar structures to the gate all around transistor and can be formed in the same processing steps. The phase change memory element includes a material whose resistance can be change by changing the structure of the material between crystalline and amorphous states. The phase change memory element is formed on a backside of the first wafer after forming the transistor, bonding the first wafer to a second wafer, and flipping the first and second wafers to expose a backside of the first wafer. Embodiments of the present disclosure provide many benefits over traditional PCRAM cells. For example, the phase change memory element of each cell can be formed below the transistor of the memory cell, thereby ensuring that the area footprint of each memory cell is approximately equal to the area footprint of the transistor of the memory cell.

FIGS. 1A-1K are cross-sectional views of an integrated circuit 100 at successive intermediate stages of processing, according to some embodiments. More particularly, FIGS. 1A-1K illustrate an exemplary process for producing a PCRAM memory cell of a PCRAM array. The PCRAM memory cell includes a gate all around transistor and a phase change memory element that includes the memory storage element of the memory cell. FIGS. 1A-1K illustrate how the memory cell can be formed in a simple and effective process in accordance with principles of the present disclosure. Other process steps and combinations of process steps can be utilized without departing from the scope of the present disclosure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1A is a cross-sectional diagram of an integrated circuit 100 at an intermediate stage of processing, according to some embodiments. In FIG. 1A, the integrated circuit 100 includes a first wafer 101. As will be set forth in more detail below, a PCRAM memory cell will be formed in the first wafer 101.

The first wafer 101 includes a semiconductor substrate 106. In the example of FIG. 1A, the semiconductor substrate 106 includes a first semiconductor layer 112, a second semiconductor layer 114 on the first semiconductor layer 112, and a third semiconductor layer 116 on the second semiconductor layer 114. In some embodiments, the first semiconductor layer 112 includes silicon; however, embodiments of the present disclosure are not limited thereto, and in various embodiments, the first semiconductor layer may include any suitable semiconductor material. The second semiconductor layer 114 can include silicon germanium. The third semiconductor layer 116 can include silicon. The first, second, and third semiconductor layers 112, 114, and 116 can collectively act as a semiconductor substrate 106. The semiconductor substrate 106 can include different numbers of layers in different semiconductor materials than those shown in FIG. 1A and described above without departing from the scope of the present disclosure. The semiconductor substrate 106 can include various doped regions including N-type and P-type dopants. N-type dopants can include phosphorus. P-type dopants can include boron. Other types of dopants can be utilized without departing from the scope of the present disclosure. In alternative embodiments, the second semiconductor layer 114 can instead be a silicon oxide layer. In this case, the substrate 106 is a silicon-on-insulator (SOI) substrate.

Figure 1B:
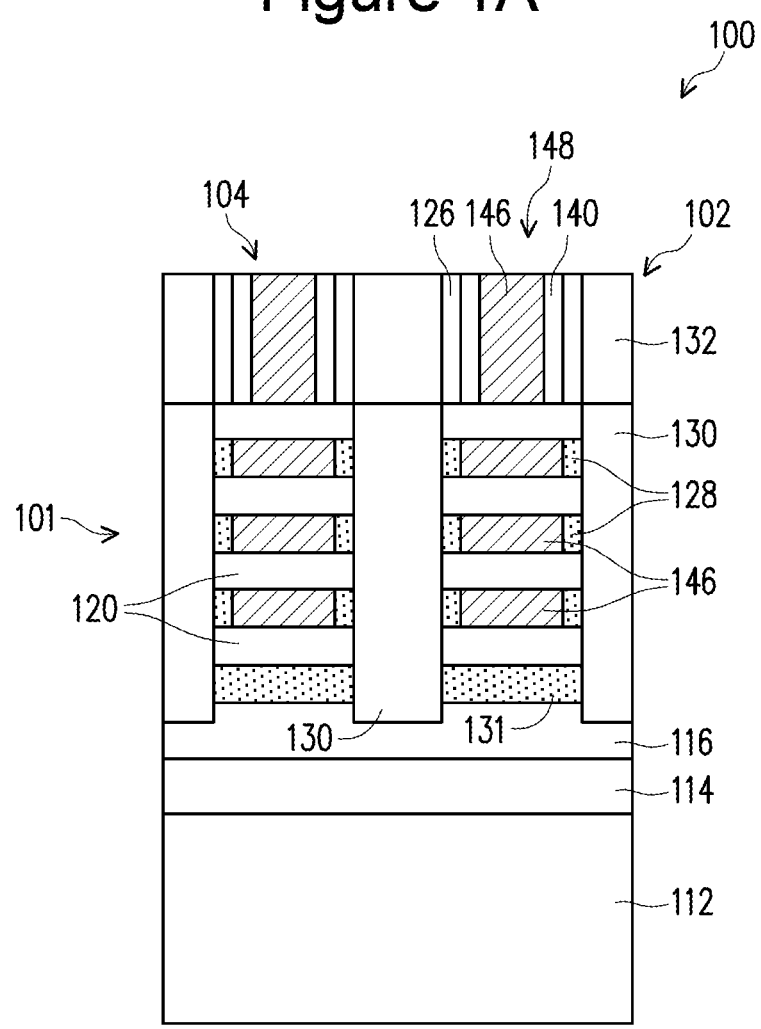

In FIG. 1B, a first transistor 102 and a second transistor 104 have been formed over the semiconductor substrate 106. The first transistor 102 and the second transistor 104 have the same types of structures and share a source/drain terminal. The following description will focus primarily on the first transistor 102. As will be described in more detail below, the transistor 102 will be part of a PCRAM memory cell.

The transistor 102 is a gate all around transistor. The gate all around transistor structure may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

The transistor 102 includes a plurality of semiconductor nanosheets 120 or nanowires. The semiconductor nanosheets 120 are layers of semiconductor material. The semiconductor nanosheets 120 correspond to the channel regions of the transistor 102. The semiconductor nanosheets 120 are formed over the substrate 106, and may be formed on the semiconductor substrate 106. The semiconductor nanosheets 120 may include one or more layers of Si, Ge, SiGe, GaAs, InSb, GaP, GaSb, InAlAs, InGaAs, GaSbP, GaAsSb or InP. In at least one embodiment, the semiconductor nanosheets 120 are the same semiconductor material as the third semiconductor layer 116. Other semiconductor materials can be utilized for the semiconductor nanosheets 120 without departing from the scope of the present disclosure. In a non-limiting example described herein, the semiconductor nanosheets 120 and the substrate 102 are silicon.

In some embodiments, the semiconductor nanosheets 120 are formed by alternating epitaxial growth processes from the third semiconductor layer 116. For example, a first epitaxial growth process may result in the formation a sacrificial semiconductor nanosheet on the top surface of the third semiconductor layer 116. A second epitaxial growth process may result in the formation of a semiconductor nanosheet 120 on the sacrificial semiconductor nanosheet. Alternating epitaxial growth processes are performed until a selected number of semiconductor nanosheets 120 and sacrificial semiconductor nanosheets have been formed.

After formation of the semiconductor nanosheets 120 and the sacrificial nanosheets between the semiconductor nanosheets 120, the sacrificial nanosheets are removed. Removal of the sacrificial nanosheets results in gaps between the semiconductor nanosheets 120.

In FIG. 1B, the transistor 102 has four semiconductor nanosheets 120. However, in practice, the transistor 102 may have other numbers of semiconductor nanosheets 120 than four. For example, the transistor 102 may include between 3 and 20 semiconductor nanosheets 120 in some embodiments. Other numbers of semiconductor nanosheets 120 can be utilized without departing from the scope of the present disclosure.

The semiconductor nanosheets 120 can have thicknesses between 2 nm and 100 nm. In some embodiments, the semiconductor nanosheets 120 have thicknesses between 2 nm and 20 nm. This range provides suitable conductivity through the semiconductor nanosheets while retaining a low thickness. In some embodiments, each nanosheet 120 is thicker than the semiconductor nanosheet(s) 120 above it. The semiconductor nanosheets 120 can have other thicknesses without departing from the scope of the present disclosure.

A sheet inner spacer layer 128 is located between the semiconductor nanosheets 120. The sheet inner spacer layer 128 can be deposited by an ALD process, a CVD process, or other suitable processes. In one example, the sheet inner spacer layer 128 includes silicon nitride.

The semiconductor nanosheets 120 extend between source and drain regions 130. The source and drain regions 130 include semiconductor material. The source and drain regions 130 can be grown epitaxially from the semiconductor nanosheets 120. The source and drain regions 130 can be epitaxially grown from the third semiconductor layer 116. The source and drain regions 130 can be doped with N-type dopants species in the case of N-type transistors. The source and drain regions 130 can be doped with P-type dopant species in the case of P-type transistors. The doping can be performed in-situ during the epitaxial growth. While the source and drain regions 130 are labeled with a common reference number and title, in practice, the transistor 102 will have a source region and a drain region. For example, the region 130 on the left of the transistor 102 may correspond to a source of the transistor 102 and the region 130 on the right of the transistor 102 may correspond to a drain of the transistor 102. Alternatively, the drain may be on the left and the source may be on the right.

An interlevel dielectric layer 132 is positioned above the source and drain regions 130. The interlevel dielectric layer 132 can include silicon oxide. The interlevel dielectric layer 132 can be deposited by CVD, ALD, or other suitable processes. Other materials and processes can be utilized for the interlevel dielectric layer 132 without departing from the scope of the present disclosure.

A gate spacer 126 is positioned on sidewalls of a gate electrode trench formed in the interlevel dielectric layer 132 above the semiconductor nanosheets 120. The gate spacer 126 includes SiCON in some embodiments. The gate spacer 126 can be deposited by CVD, PVD, or ALD. Other materials and deposition processes can be utilized for the gate spacer 126 without departing from the scope of the present disclosure.

Though not shown in FIG. 1B, a thin interfacial dielectric layer is formed on the surfaces of the semiconductor nanosheets 120. The interfacial dielectric layer can include a dielectric material such as silicon oxide, silicon nitride, or other suitable dielectric materials. The interfacial dielectric layer can be formed by a thermal oxidation process, a CVD process, or an ALD process. The interfacial dielectric layer can have a thickness between 0.5 nm and 2 nm. Other materials, deposition processes, and thicknesses can be utilized for the interfacial dielectric layer without departing from the scope of the present disclosure.

The interfacial dielectric layer surrounds the semiconductor nanosheets 120. In particular, the semiconductor nanosheets 120 have a shape corresponding to a slat or wire extending between the source and drain regions 130. The interfacial dielectric layer wraps around each semiconductor nanosheet 120. The interfacial dielectric layer surrounds or partially surrounds the semiconductor nanosheets 120.

Though not shown in FIG. 1B, a high-K gate dielectric layer is formed on the interfacial dielectric layer, on the sidewalls of the gate spacers 126, and on the sidewalls of the sheet inner spacers 128. Together, the high-K gate dielectric layer and the interfacial dielectric layer correspond to a gate dielectric of the transistor 102. The high-K dielectric layer surrounds or partially surrounds the semiconductor nanosheets 120 in the same way as described in relation to the interfacial dielectric layer, except that the interfacial dielectric layer is between the semiconductor nanosheets 120 and the high-K gate dielectric layer.

The high-K gate dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer may be formed by CVD, ALD, or any suitable method. In some embodiments, the high-K gate dielectric layer is formed using a highly conformal deposition process such as ALD in order to ensure the formation of a gate dielectric layer having a uniform thickness around each semiconductor nanosheet 104. In some embodiments, the thickness of the high-k dielectric layer is in a range from about 1 nm to about 4 nm. Other thicknesses, deposition processes, and materials can be utilized for the high-K gate dielectric layer without departing from the scope of the present disclosure.

A gate electrode 148 fills the remaining space between the semiconductor nanosheets 120 and the trench above the semiconductor nanosheets 120 between the gate spacers 126. The gate electrode 148 may include multiple individual layers of gate metals. The materials and thicknesses of the various layers of gate metals can be selected to provide a desired threshold voltage of the transistor 102. The gate electrode 148 can include a layer of TiN 140 lining the gate spacers 126 and covering the gate dielectric on the semiconductor nanosheets 120.

The gate electrode 148 includes a gate fill material 146 positioned on the metal layer 140 in the trench and between semiconductor nanosheets 120. In one example, the gate fill material 146 includes tungsten. The gate fill material 146 can be deposited using PVD, ALD, CVD, or, other suitable deposition processes. The gate fill material 146 fills the remaining space in the trench and between semiconductor nanosheets 120. The gate fill material is highly conductive.

The metal layer 140 and the gate fill material 146 surround or partially surround the semiconductor nanosheets 120 in the same way as described above in relation to the interfacial dielectric layer and the high-K gate dielectric layer, except that the interfacial dielectric layer and the high-K gate dielectric layer are positioned between the semiconductor nanosheets 120 and the metal layer 140 and gate fill material 146.

Figure 1C:
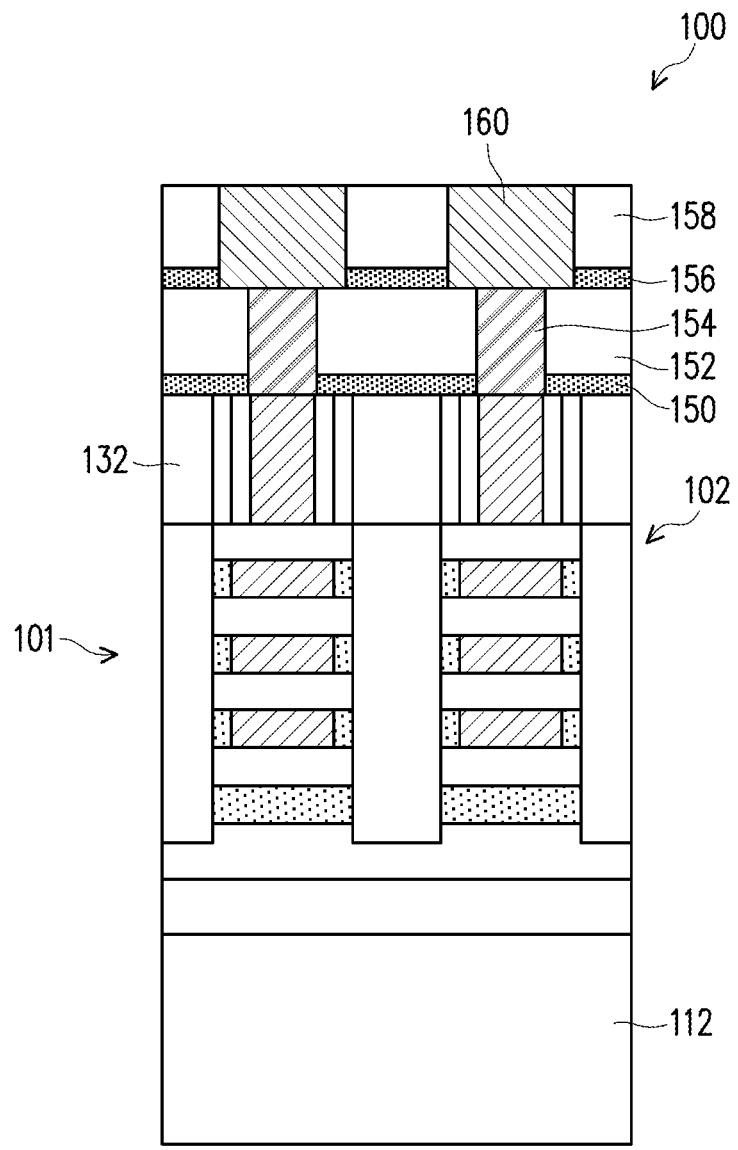
Figure 1D:
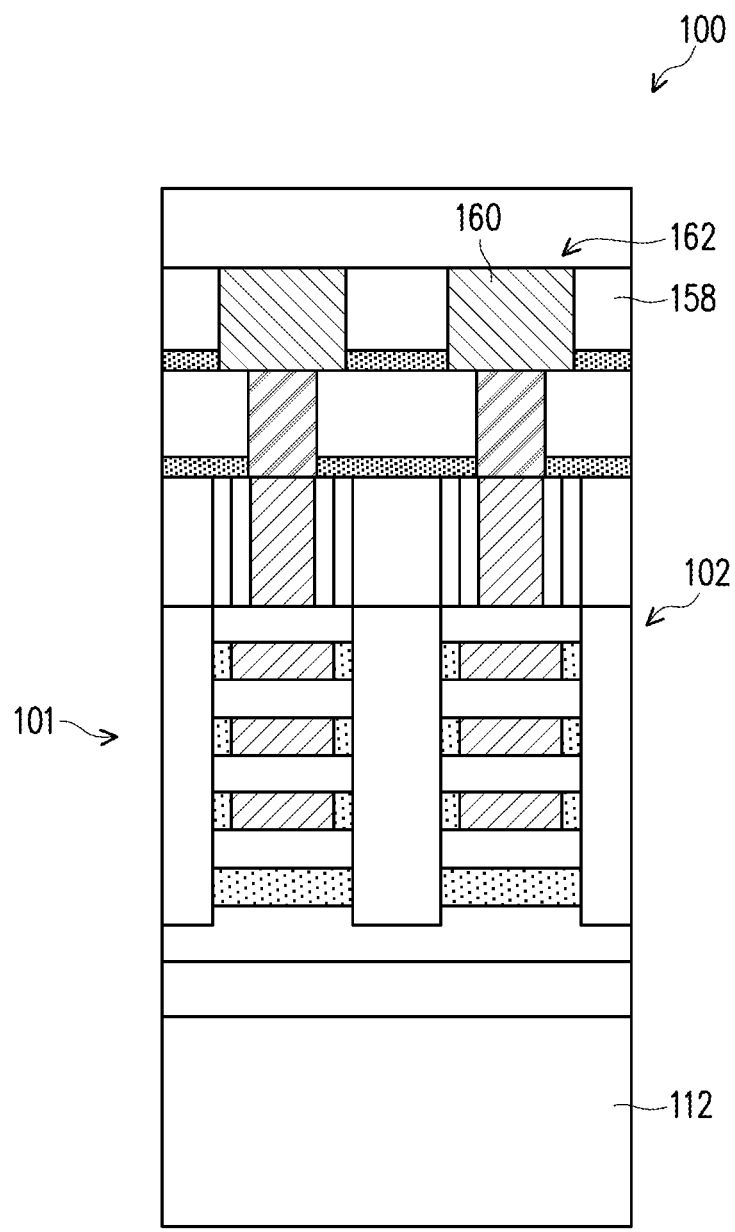

In FIG. 1C, a dielectric layer 150 has been formed on the interlevel dielectric layer 132. The dielectric layer 150 can include silicon nitride or other types of dielectric material. The dielectric layer 150 can be deposited by CVD, PVD, or ALD. An interlevel dielectric layer 152 has been deposited on the dielectric layer 150. The interlevel dielectric layer 152 can include silicon oxide. The interlevel dielectric layer 152 can be deposited by CVD, ALD, or other suitable processes. Other materials and processes can be utilized for the interlevel dielectric layer 152 without departing from the scope of the present disclosure.

A contact plug 154 has been formed in the interlevel dielectric layer 152. The contact plug 154 is in electrical contact with the gate electrode 148 of the transistor 102. The contact plugs 154 can include tungsten or another suitable conductive material.

A dielectric layer 156 has been formed on the interlevel dielectric layer 152. The dielectric layer 156 can include silicon nitride or other types of dielectric material. The dielectric layer 156 can be deposited by CVD, PVD, or ALD. An interlevel dielectric layer 158 has been deposited on the dielectric layer 150. The interlevel dielectric layer 158 can include silicon oxide. The interlevel dielectric layer 158 can be deposited by CVD, ALD, or other suitable processes. Other materials and processes can be utilized for the interlevel dielectric layer 158 without departing from the scope of the present disclosure.

A metal line 160 has been formed in the interlevel dielectric layer 158. The metal line 160 is in contact with the contact plugs 154. The metal line 160 can include copper or other suitable conductive materials. In one example, the metal line 160 is a wordline of the PCRAM memory cell.

An interlevel dielectric layer 162 has been deposited on the dielectric layer 158 and on the signal line 160. The interlevel dielectric layer 162 can include silicon oxide. The interlevel dielectric layer 162 can be deposited by CVD, ALD, or other suitable processes. Other materials and processes can be utilized for the interlevel dielectric layer 162 without departing from the scope of the present disclosure.

After depositing the interlevel dielectric layer 162, a chemical mechanical planarization (CMP) process is performed on the interlevel dielectric layer 162. The CMP process is performed to prepare the wafer 101 for a wafer bonding process, as will be set forth in more detail below.

As set forth herein, the wafer 101 can be said to have a front-end and a backend. Traditionally, the backend corresponds to the bulk semiconductor substrate. In this case, the substrate 106 can be referred to as the backend or backside of the first wafer 101. The side of the wafer 101 in which the dielectric layer 164 is positioned can be referred to as the front-end or front side of the wafer 103.

Figure 1E:
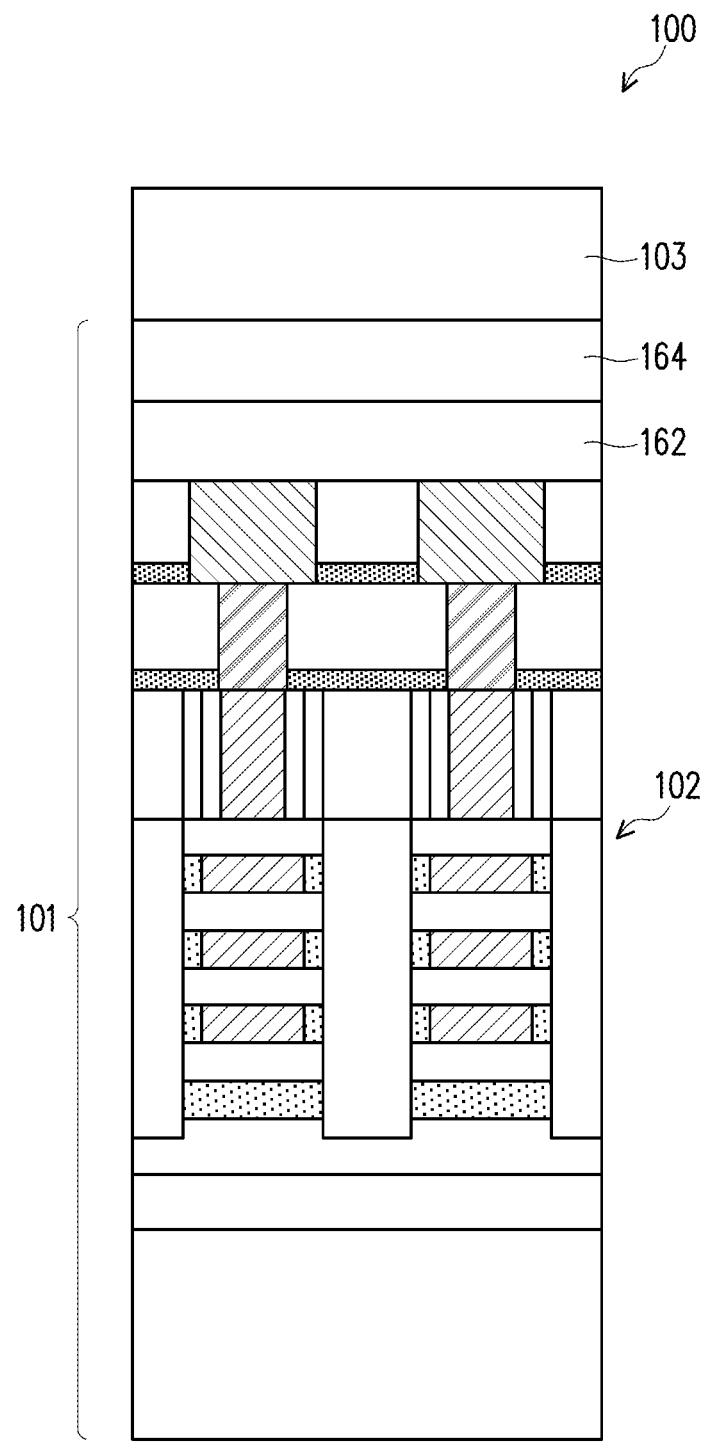

In FIG. 1E, a second wafer 103 has been bonded to the first wafer 101. A dielectric layer 164 may be formed on the second wafer 103. Alternatively, the dielectric layer 164 may be part of the second wafer 103. The dielectric layer 164 may undergo a CMP process prior to bonding the second wafer 103 to the first wafer 101. Bonding the second wafer 103 to the first wafer 101 can include bonding the dielectric layer 164 to the dielectric layer 162. The second wafer 103 may include a semiconductor material. In some embodiments, the second wafer 103 includes silicon. The second wafer 103 may include a silicon on insulator (SOI) structure.

The second wafer 103 can be termed a carrier wafer. The carrier wafer enables flipping of the first wafer 101 so that additional structures may be formed on the backside or backend of the first wafer 101, as will be set forth in more detail below.

The wafer bonding process includes bonding the first wafer 101 to the second wafer 103. Although FIG. 1E illustrates a wafer bonding process in which to surface level dielectric layers 162 and 164 are bonded together, other types of wafer bonding processes can be performed. Other techniques can include direct bonding, surface activated bonding, anode bonding, eutectic bonding, reactive bonding, or other suitable bonding processes. The result of the wafer bonding process is that the first wafer 101 is bonded to the second wafer 103.

Figure 1F:
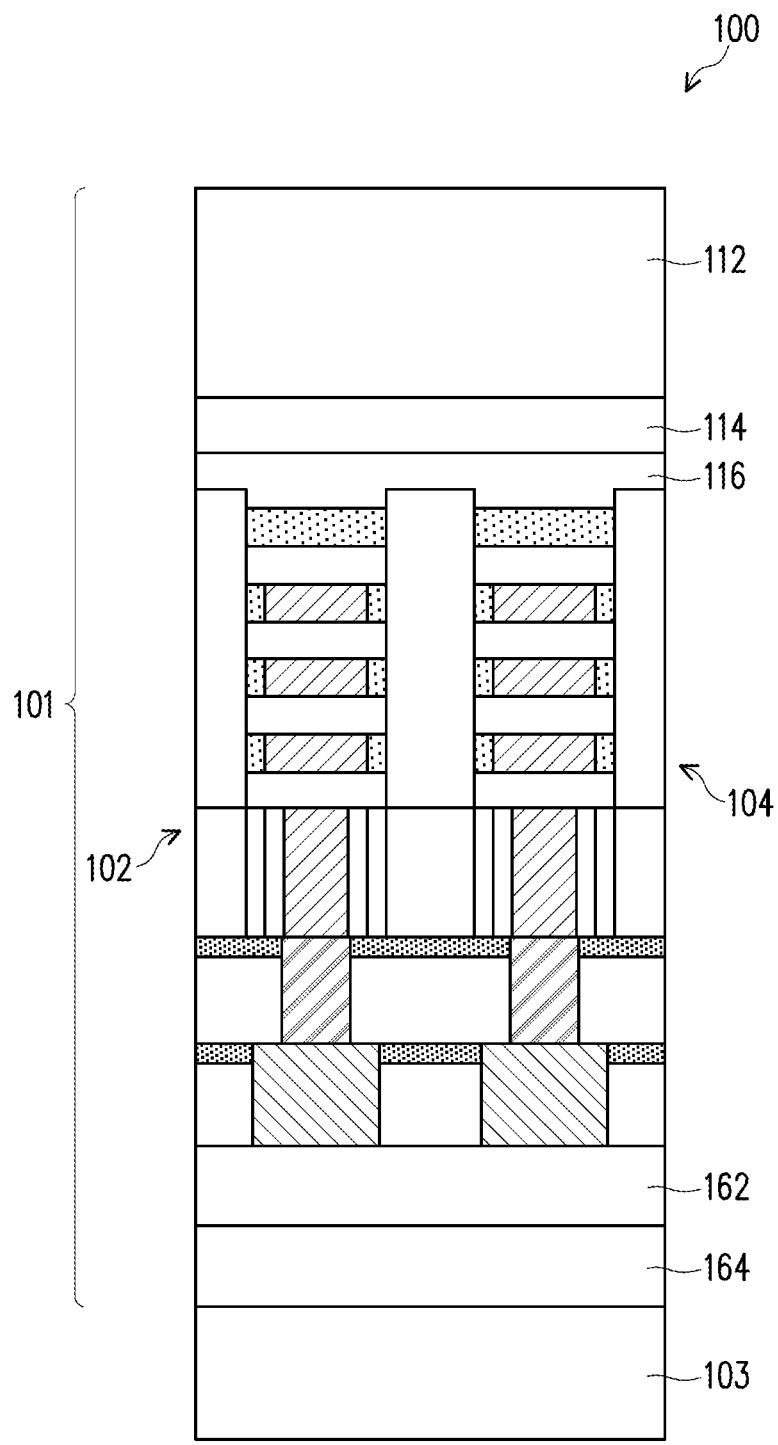

In FIG. 1F, the integrated circuit 100 has been flipped with respect to the position shown in FIGS. 1A-1E. The carrier wafer 103 is now on the bottom. The backend of the wafer 101, in particular the first semiconductor layer 112, is now on the top. This position allows for further processes to be performed on the backend of the wafer 101. As will be set forth in more detail below, the further processes include forming the remainder of a PCRAM memory cell in conjunction with the transistor 102.

Figure 1G:
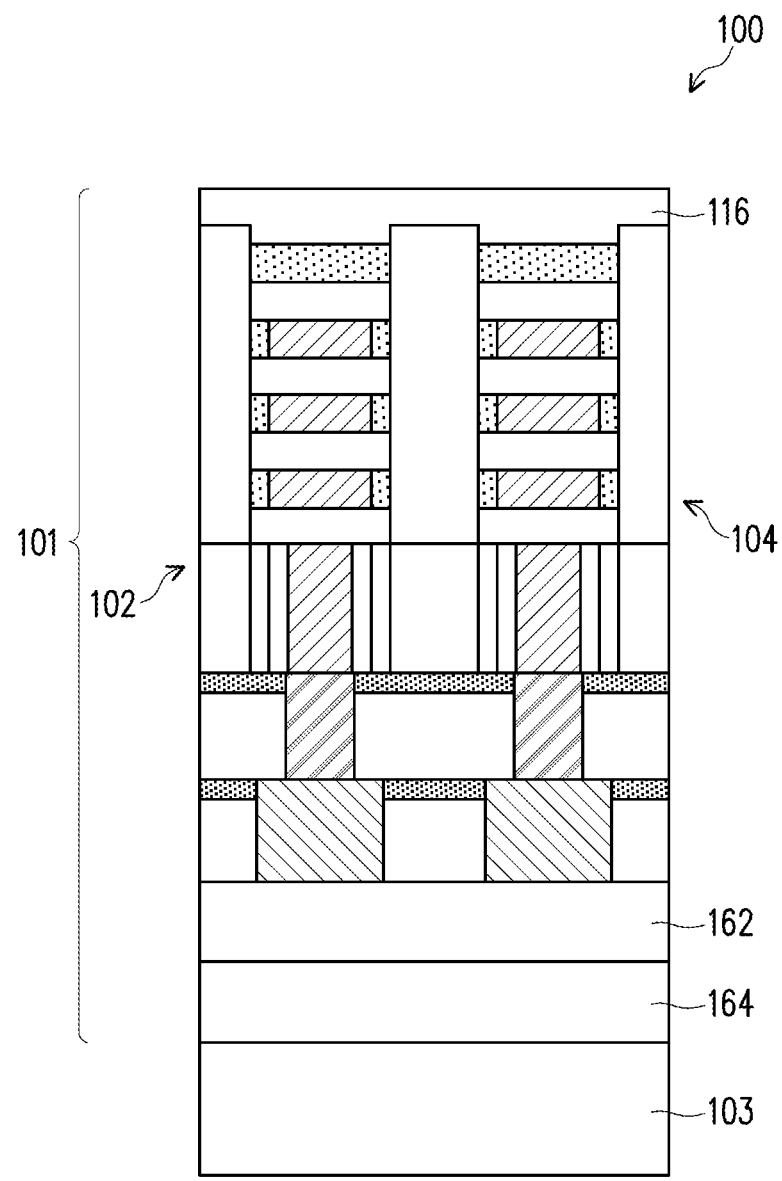

In FIG. 1G, an etching process has been performed to thin down the semiconductor substrate 106. In particular, the first and second semiconductor layers 112, 114 are entirely removed. The third semiconductor layer 116 is exposed in FIG. 1G. The etching process can include a wet etch, a dry etch, or a combination of etching processes.

Figure 1H:
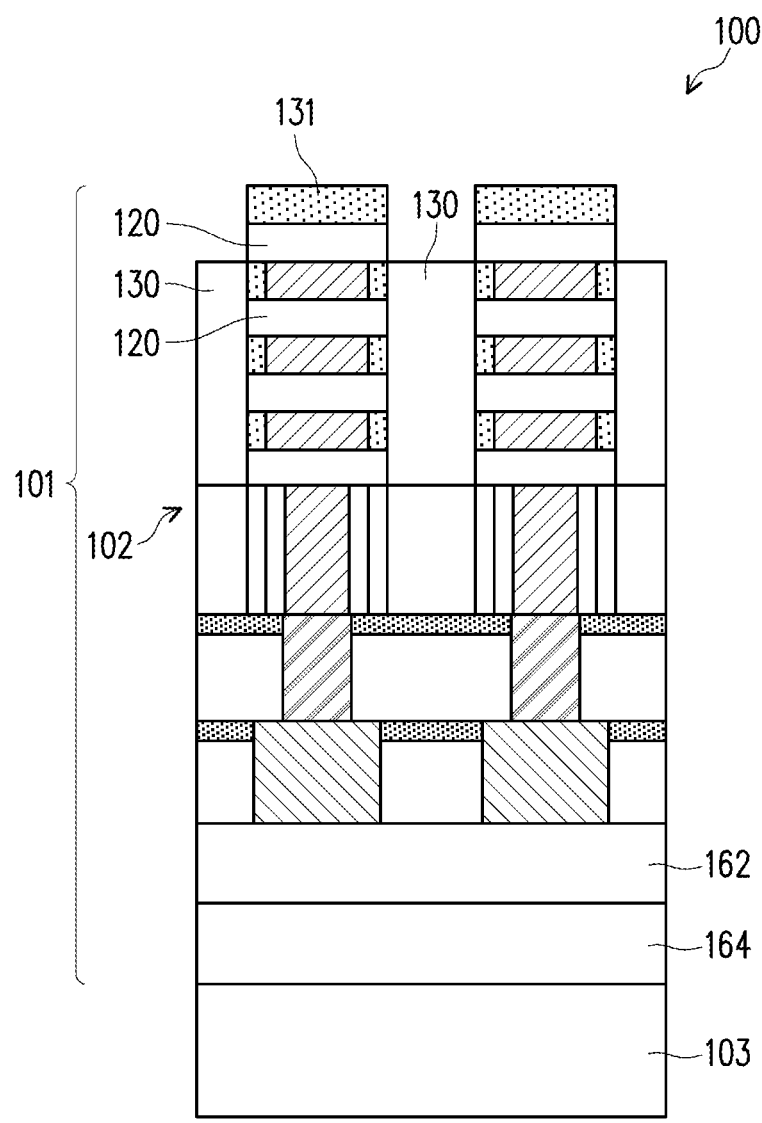

In FIG. 1H, the third semiconductor layer 116 has been removed. The third semiconductor layer 116 can be removed with a wet etch, a dry etch, or a combination of etching processes. Removal of the third semiconductor layer 116 exposes the source and drain regions 130 of the transistors 102 and 104. Removal of the third semiconductor layer 116 also exposes the bottom semiconductor nanosheet 120 and the spacer silicon nitride spacer 131.

Figure 1I:
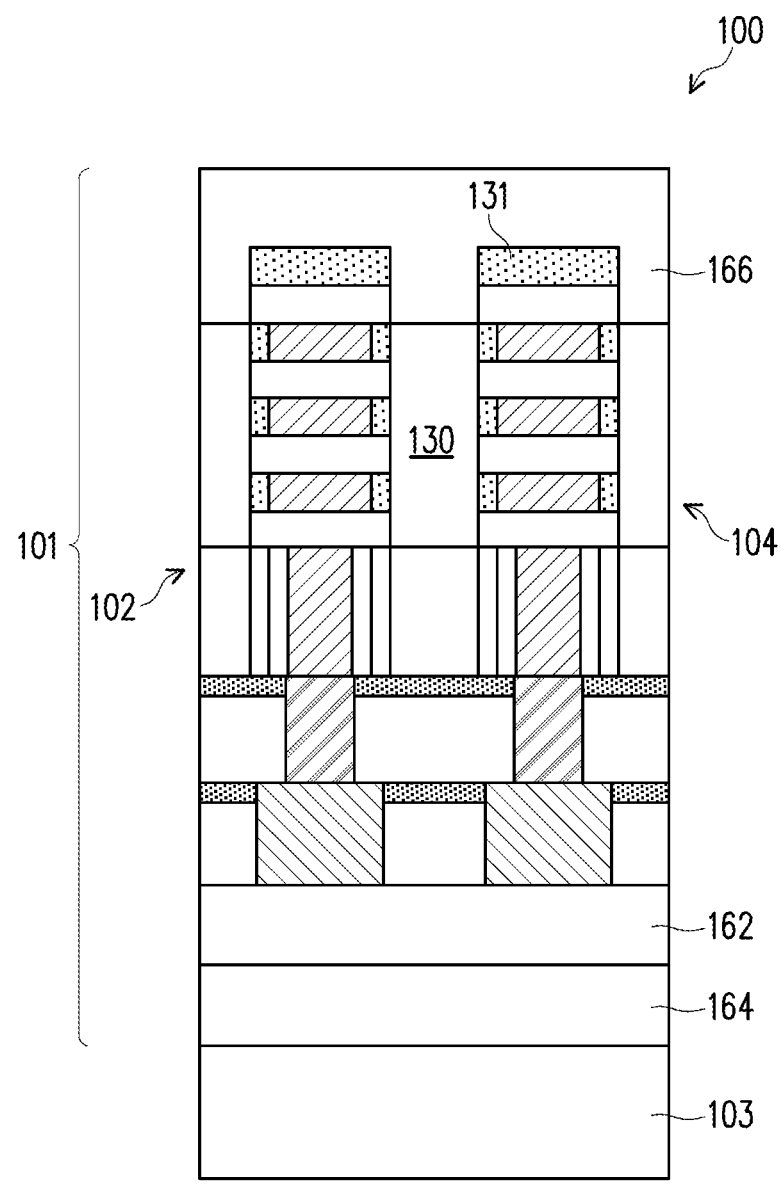

In FIG. 1I, a dielectric layer 166 has been formed on the exposed portions of the source and drain regions 130 and on the exposed nanosheets 120 and spacers 131. The dielectric layer 166 can include SiCN, silicon oxide, or combination of SiCN and silicon oxide layers. The dielectric layer 166 can be deposited by CVD, ALD, or PVD. Other materials and deposition processes can be utilized for the dielectric layer 166 without departing from the scope of the present disclosure.

Figure 1J:
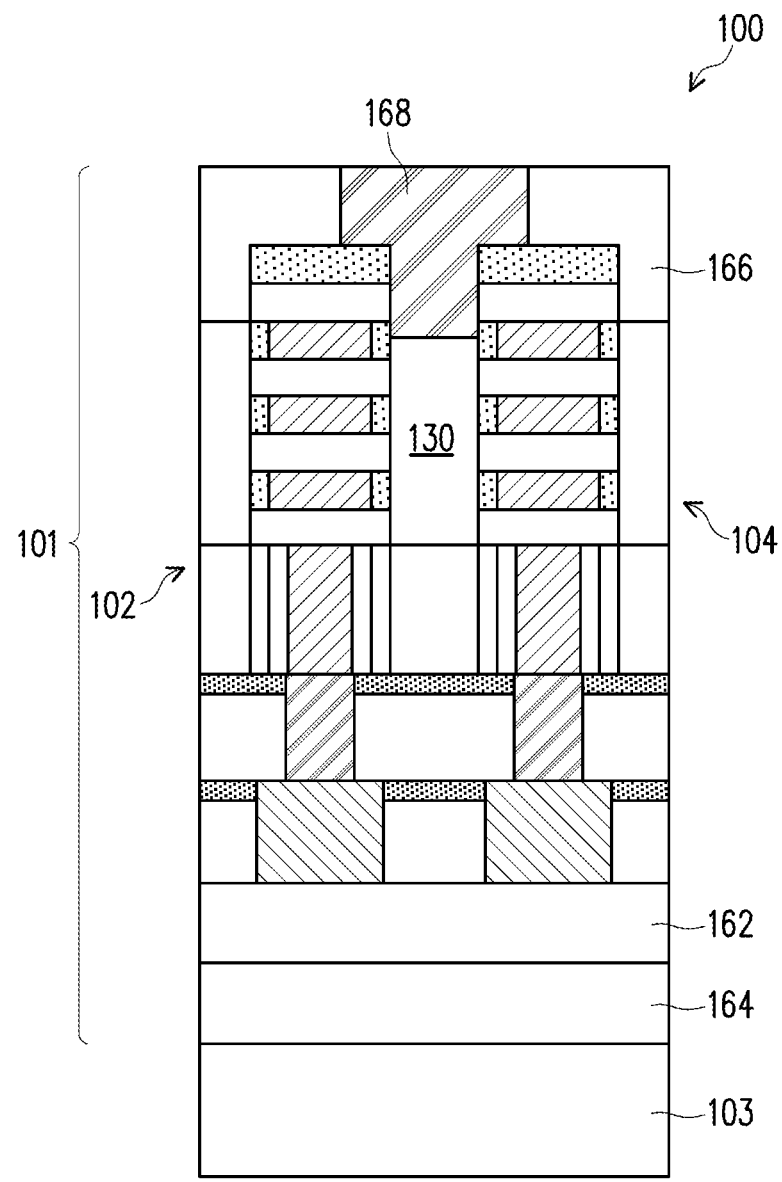

In FIG. 1J, a trench has been etched in the dielectric layer 166. The trench exposes the joint source/drain layer 130 of the transistors 102 and 104, as well as portions of the bottom semiconductor nanosheet 120 and spacer 131. A bottom electrode 168 has been formed in the trench in the dielectric layer 166. The bottom electrode 168 is in direct contact and in electrical connection with the joint source/drain region 130 of the transistors 102 and 104. The bottom electrode 168 includes tungsten, though other conductive materials can be utilized without departing from the scope of the present disclosure. Though not shown in FIG. 1J, prior to forming the bottom electrode 168, a silicide may be formed on the exposed portion of the joint source/drain region 130. The silicide may include nickel silicide, titanium silicide, or cobalt silicide.

Figure 1K:
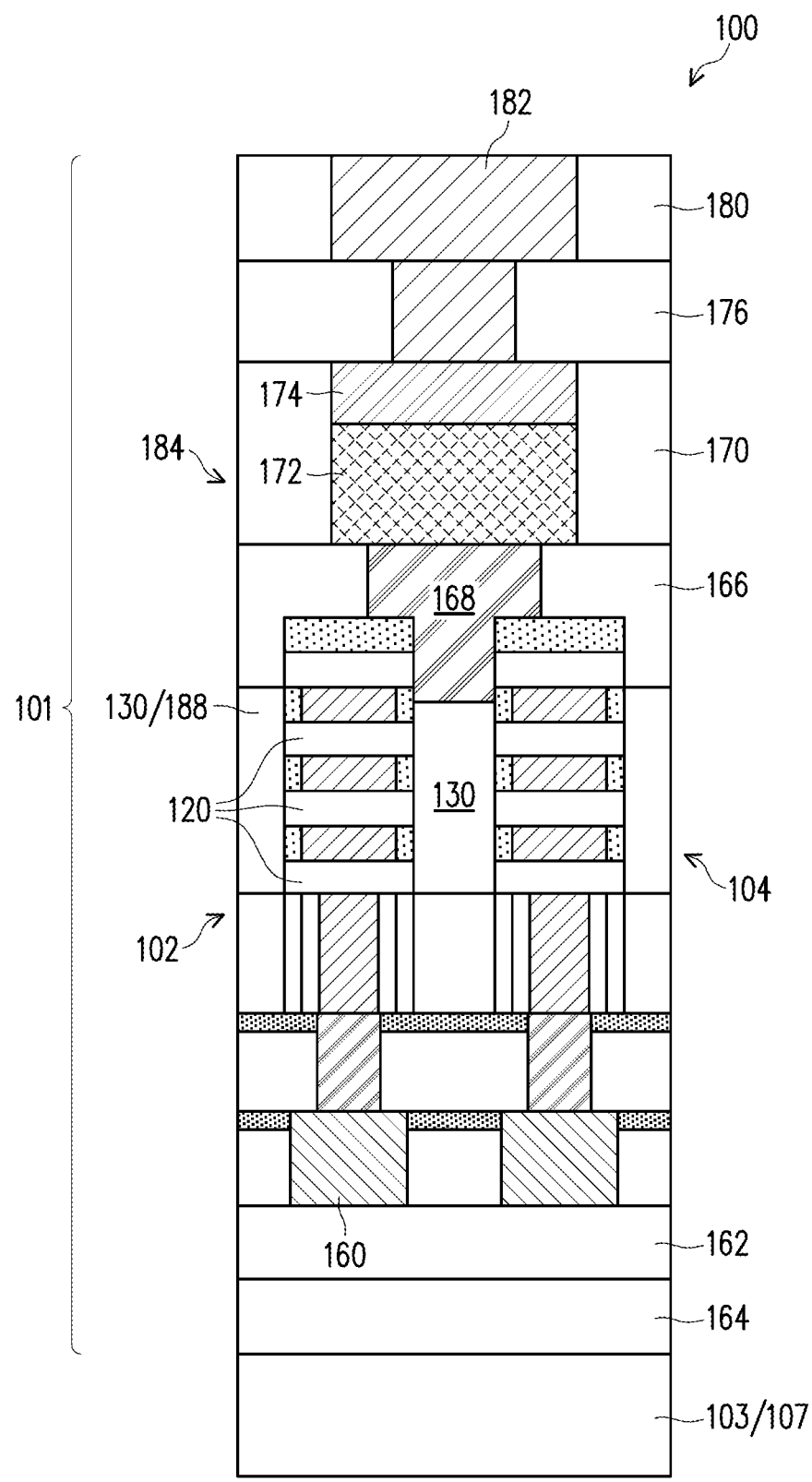

In FIG. 1K, a dielectric layer 170 has been formed on the dielectric layer 166. The dielectric layer 170 can include silicon oxide or other suitable dielectric materials. The dielectric layer 170 can be deposited by CVD, ALD, PVD, or other suitable deposition processes.

In FIG. 1K, a trench has been etched in the dielectric layer 170 exposing the bottom electrode 168. A phase change memory element 172 has been formed in the trench in the dielectric layer 170. The phase change memory element 172 is in direct contact with the bottom electrode 168. The phase change memory element 172 can be deposited by PVD, ALD, CVD, or other suitable deposition processes.

The phase change memory element 172 includes a conductive material that has an electrical resistance based on the structural state or phase of the material. For example, if the phase change memory element 172 has a crystalline structure then the phase change memory element 172 will have a first electrical resistance. If the phase change memory element 172 has an amorphous structure, then the phase change memory element 172 will have a second electrical resistance different than the first electrical resistance.

The structure of the phase change memory element 172 can be switched from crystalline to amorphous by heating the phase change memory element 172 and rapidly cooling the phase change memory element 172. The rapid cooling prevents the heated phase change memory element 172 from reforming in a crystalline state. The structure of the phase change memory element 172 can be switched from amorphous to crystalline by heating the phase change memory element 172 and then slowly cooling the phase change memory element 172. The slow cooling process causes the phase change memory element 172 to reform in a crystalline state.

The phase change memory element 172 can include a chalcogenic material. The chalcogenic material can be selectively changed between crystalline and amorphous states as described above. In some embodiments, the phase change memory element 172 includes GeSbTe (GST), though other phase change materials can be utilized for the phase change memory element 172 without departing from the scope of the present disclosure.

In FIG. 1K, a top electrode 174 has been formed on the phase change memory element 172. The top electrode 174 is in direct contact with the phase change memory element 172. The top electrode 174 can include TiN or other suitable conductive materials. In one example, the top electrode 174 is utilized as a heater for heating the phase change memory element 172 in order to change the phase of the phase change memory element from crystalline to amorphous or from amorphous to crystal. When the current is passed through the top electrode 174, the top electrode becomes very hot and heats the phase change memory element 172.

In FIG. 1K, a dielectric layer 176 has been formed on the dielectric layer 170. The dielectric layer 176 can include silicon oxide or other suitable dielectric materials. A contact plug 178 has been formed in the dielectric layer 176. The contact plug is in direct contact with the top electrode 174. The contact plug can include tungsten or another suitable conductive materials.

In FIG. 1K, a dielectric layer 180 has been formed on the dielectric layer 176. The dielectric layer 180 can include silicon oxide or other suitable dielectric materials. A metal line 182 has been formed in the dielectric layer 180. The metal line is a signal line for passing signals to and from the transistor 102. In one example, the metal line 182 is a bitline. The metal line 182 can include copper or other suitable conductive materials.

In FIG. 1K a PCRAM memory cell 184 has been formed in the first wafer 101. The memory cell includes the transistor 102 and the phase change memory element 172. Data is stored in the PCRAM memory cell 184 by selectively changing the phase, and, thus, the electrical resistance of the phase change memory element 172. Accordingly, the phase change memory element 172 is the data storage unit of the memory cell 184.

In one example, the phase change memory cell 184 stores a data value of 0 when the phase change memory element 172 is in the amorphous phase. The phase change memory cell 184 stores a data value of 1 when the phase change memory element 172 is in the crystalline phase. The data value can be changed from 0 to 1 by changing the phase of the phase change memory element 172 from amorphous to crystalline. This can be accomplished by passing a current through the phase change memory element 172. The current also passes through the top electrode 174, thereby causing the top electrode 174 to generate a large amount of heat. The heat causes the phase change memory element 172 to melt. The magnitude of the current is gradually reduced so that the phase change memory element 172 will solidify slowly. The slow solidification of the phase change memory element 172 causes the phase change memory element 172 to solidify in the crystalline phase, thereby changing the data value from 0 to 1.

The data value can be changed from 1 to 0 by changing the phase of the phase change memory element 172 from crystalline to amorphous. This can be accomplished by passing a current through the phase change memory element 172, as described previously. The current causes the top electrode 174 to generate heat and develop the phase change memory element 172. When the phase change memory element 172 is sufficiently hot, the current is stopped suddenly so that the phase change memory element 172 cools rapidly. The rapid cooling of the phase change memory element 172 causes the phase change memory element 172 to solidify in the amorphous state, thereby changing the data value from 1 to 0.

As described previously, the resistance of the phase change memory element 172 is different in the crystalline and amorphous phases. Accordingly, data can be read from the memory cell 184 by directly or indirectly detecting the electrical resistance of the phase change memory element 172. Data can be read by applying a voltage across the top electrode 174 and the bottom electrode 168 and determining the magnitude of the resulting current. Data can be read by passing a current through the phase change memory element 172 and detecting the voltage drop across the phase change memory element 172.

In one example, the metal line 160 is a wordline coupled to the memory cell 184. The metal line 182 is a bitline coupled to the memory cell 182. The source/drain region 130 that is not in direct contact with the bottom electrode 168 can correspond to a source line of the memory cell 184. The transistor 102 can be turned on by applying a selected voltage to the gate electrode 148 via the wordline 160. This enables a current to flow through the semiconductor nanosheets 120 of the transistor 102. In particular, the current flows from the bitline 182, through the phase change memory element 172, through the joint source and drain/ region 130, through the semiconductor nanosheets 120, and through the other source drain region 130 that corresponds to the source line. Alternatively, current can flow in the opposite direction as described above depending on the application of voltages.

Although two transistors 102 and 104 are shown as being coupled together via the joint source drain region 130, other configurations can be utilized. For example, the transistor 102 may not share a source/drain region with another transistor. Many types of electrical connections and configurations of transistors can be utilized without departing from the scope of the present disclosure.

The memory cell 184 is formed in the footprint of the transistor 102 or in the footprints of the transistors 102 and 104. Thus, little or no additional area is utilized to form the phase change memory element 172. Instead, the phase change memory element 172 is formed directly below the transistor 102 in the backend of the first wafer 101. Forming the phase change memory element 172 in the backend of the first wafer 101 allows for enormous savings in area with respect to other types of memory cells in memory arrays.

Although FIGS. 1A-1K illustrate a process for forming a single PCRAM memory cell 184, in practice this process forms an entire array of PCRAM memory cells in the integrated circuit 100. Accordingly, the integrated circuit 100 includes a large number of memory cells 184 connected in an array via the metal interconnects 160 and 182.

Though not shown in FIG. 1K, additional dielectric layers and metal interconnect structures can be formed above the metal line 182. The metal interconnect structures can be utilized to connect memory cells of the PCRAM array. The metal interconnect structures can be utilized to connect memory cells 184 to row and column decoders and other circuitry associated with reading from and writing data to the PCRAM array.

Although not shown in FIG. 100, the integrated circuit 100 can include contact structures above the metal line 160. The structures are above the metal line 160 when the orientation of the integrated circuit 100 is such that the second wafer 103 is above the first wafer 101. The structures are below the metal line 160 and the orientation of the integrated circuit 100 is such that the second wafer 103 is below the first wafer 101. These contact structures can be used for wire bonding, or other types of metal connections for connecting to the integrated circuit 100. Alternatively, or additionally, the metal interconnect structures can be formed in the dielectric layers 162 and 164 and in the second wafer 103. Contact structures can be formed on the bottom of the second wafer 1034 enabling electrical connection to the integrated circuit 100.

In FIGS. 1A-1K, a process has been shown performing a PCRAM memory cell 184 in an integrated circuit 100. The description of FIGS. 1A-1K makes reference to the first wafer 101 and the second wafer 103 because the process for forming the memory cell 184 occurs while the first wafer 101 and the second wafer 103 are intact. However, the finished integrated circuit 100 does not include the entirety of the first wafer 101 and the second wafer 103. Instead, the integrated circuit 100 is diced from the first wafer 101 and the second wafer 103. Accordingly the integrated circuit 100 includes a first chip 105 that has been diced from the first wafer 101. The integrated circuit 100 includes a second chip 107 has been diced from the second wafer 103. Thus, the process for forming the integrated circuit 100 occurs with wafers, but the finish integrated circuit 100 includes first and second chips diced from the wafers.

Figure 2:
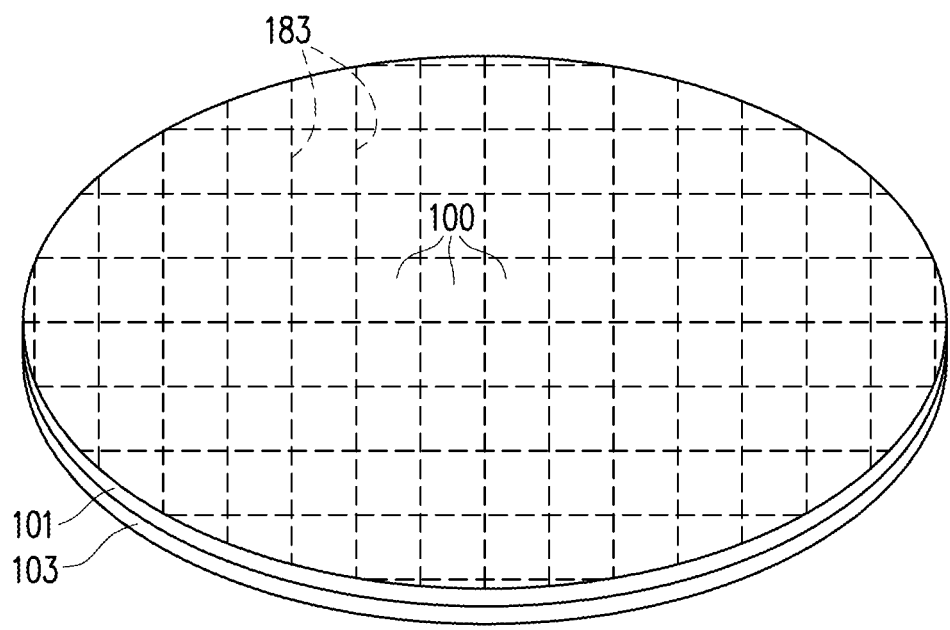
FIG. 2 is an illustration of bonded wafers prior to dicing into individual integrated circuits, according to some embodiments.

FIG. 2 illustrates the first wafer 101 and the second wafer 103 bonded together prior to dicing. Dicing lines 183 are shown on the first wafer 101. The dicing lines indicate how the bonded wafers will be diced into individual integrated circuits 100. Each individual integrated circuit 100 includes an array of PCRAM memory cells 184 as shown in FIG. 1K. After the integrated circuits have been diced from the wafers 101 and 103, the integrated circuits 100 may be coupled to the frames or other substrates and encapsulated integrated circuit packages. Various dicing and packaging techniques, components, and systems can be utilized for the integrated circuits 100 without departing from the scope of the present disclosure.

Figure 3:
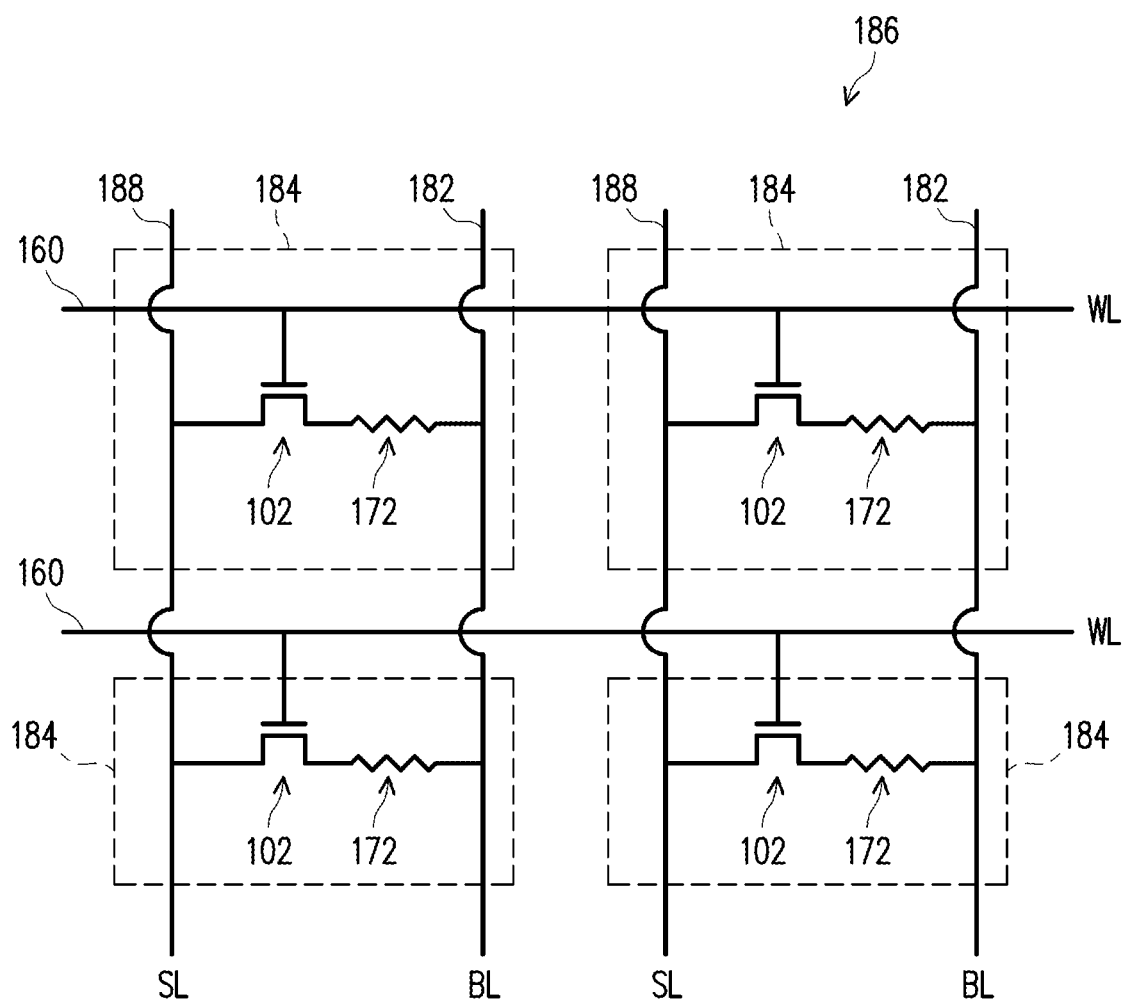
FIG. 3 is a schematic diagram of a phase change random access memory array, according to some embodiments.

FIG. 3 is a schematic diagram of a PCRAM memory array 186, according to one embodiment. The PCRAM memory array 186 includes a plurality of PCRAM memory cells 184. Each PCRAM memory cell includes a transistor 102 and a phase change memory element 172 as described in relation to FIG. 1K.

In practice, the memory array 186 may include thousands or millions of memory cells 184 arranged in rows and columns. Each row of memory cells 184 is coupled to a respective wordline 160. Each column of memory cells 184 is coupled to a respective source line 188 and a respective bitline 182. As described in relation to FIG. 1K, the phase change memory elements 172 are the data storage elements of the memory cells 184. Though not shown in FIG. 3, the memory array 186 may include or may be coupled to additional circuitry for writing data to the memory cells 184 and for reading data from the memory cells 184. Such additional circuitry may include row decoders, column decoders, sense amplifiers, charge pumps, read voltage regulators, clock signal generators, timing signal generators, or other circuit components that may be utilized in writing data to or reading data from the memory cells 184 of the memory array 186.

The memory array 186 of FIG. 3 illustrates memory cells 184 that include only a single transistor 102 and a single phase change memory element 172. This is known as a 1T1R configuration. However, other configurations are possible for the memory cells 184. For example, each memory cell 184 may include a single phase change memory element 172 and two or more transistors 102. These configurations are known as nT1R, where n is a positive integer. In another example, each memory cell 184 may include a single transistor 102 and multiple phase change memory elements 172. These configurations are known as 1TmR, where m is a positive integer.

Figure 4A:
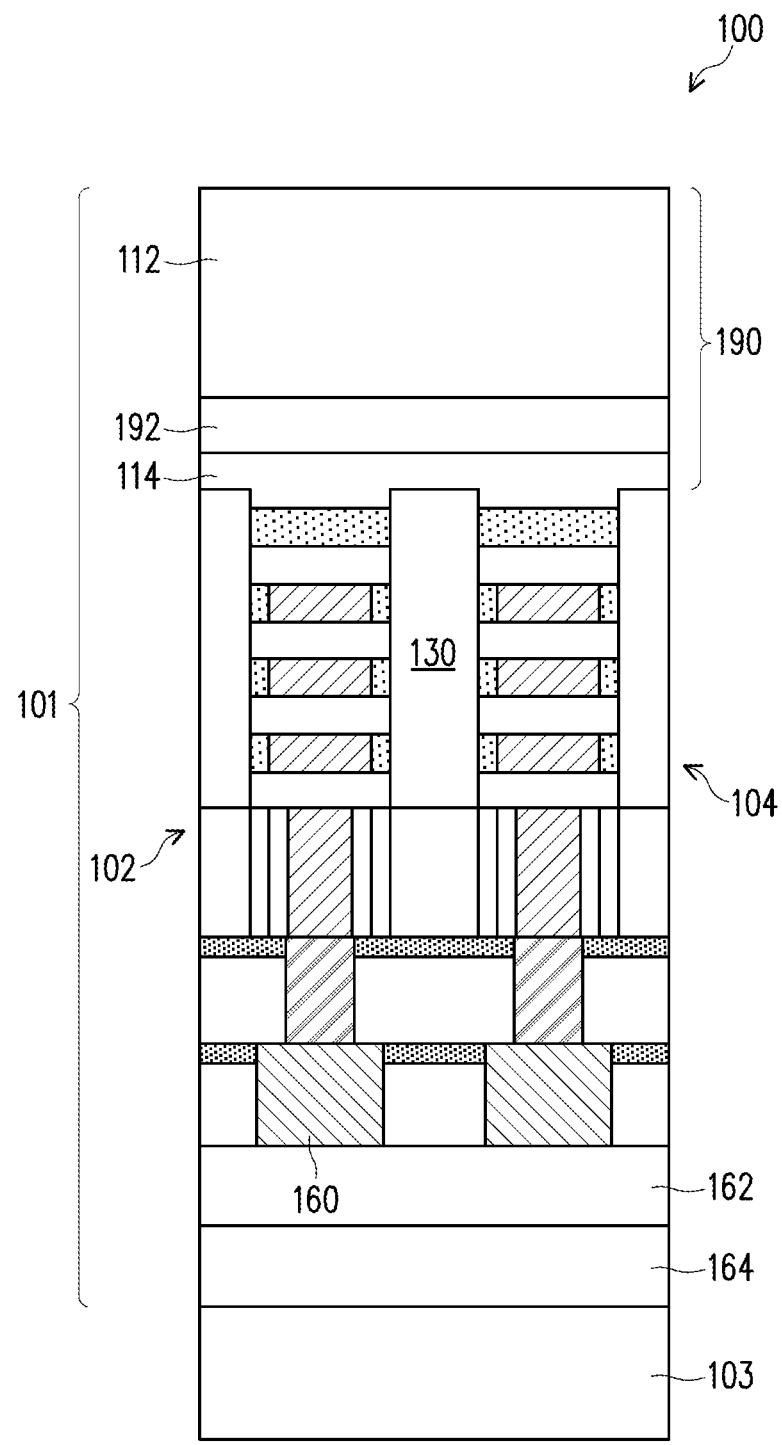
FIGS. 4A-4D are cross-sectional views of an integrated circuit including a phase change random access memory cell at various stages of processing, according to some embodiments.

FIGS. 4A-4D are cross-sectional views of an integrated circuit 100 during intermediate stages of processing, according to one embodiment. FIGS. 4A-4D illustrate an alternative process for forming a PCRAM memory cell 184. The integrated circuit 100 in FIG. 4A is substantially similar to the integrated circuit 100 of FIG. 1F. The transistor 102 has been formed in the first wafer 101, the second wafer 103 has been bonded to the first wafer 101, and the first and second wafer had been flipped so that the backend of the first wafer 101 is on top. The first wafer 101 of FIG. 4A differs from the first wafer 101 of FIG. 1F in that the FIG. 4A, the first wafer 101 is a Sol wafer. In particular, the substrate 190 includes a first semiconductor layer 112, an oxide layer 192, and a second semiconductor layer 114.

Figure 4B:
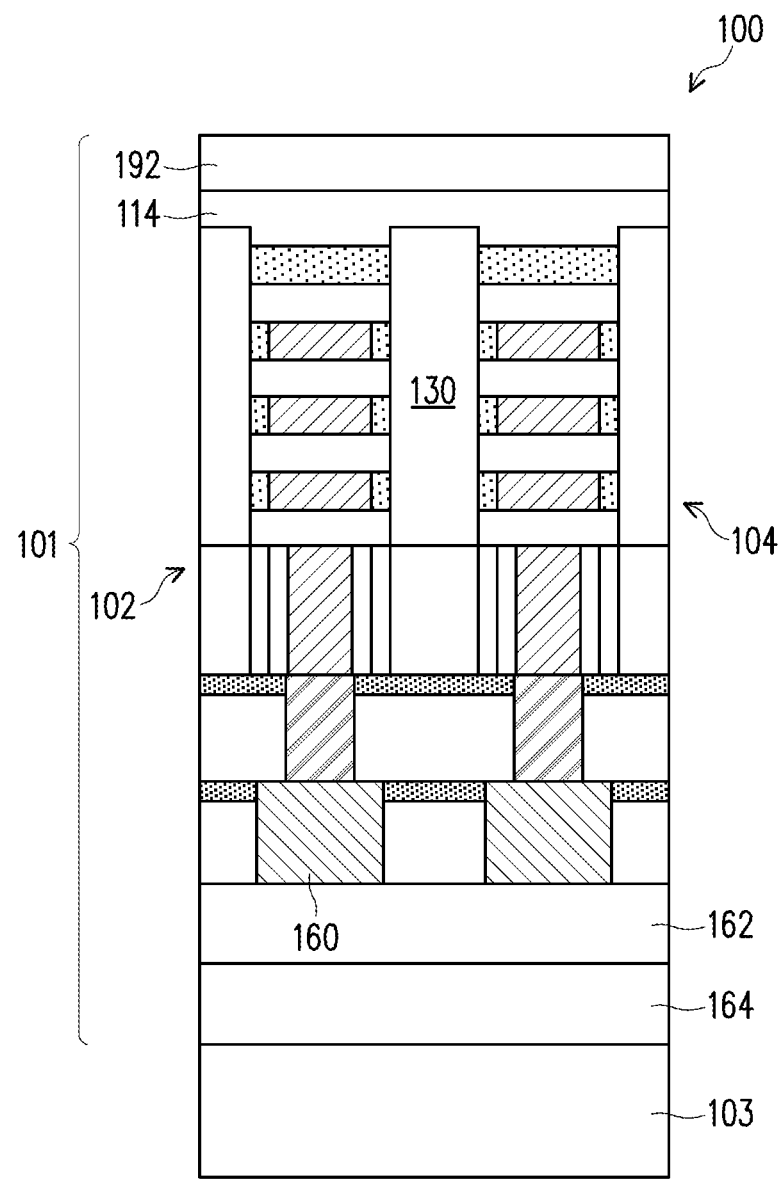

In FIG. 4B, the first semiconductor layer 112 has been removed via an etching process. The etching process can include a wet etch, a dry etch, or a combination of wet and dry etches. The insulator layer 192 is exposed after removal of the first semiconductor layer 112. Accordingly, the oxide layer 192 acts as an etch stop for etching the first semiconductor layer 112.

Figure 4C:
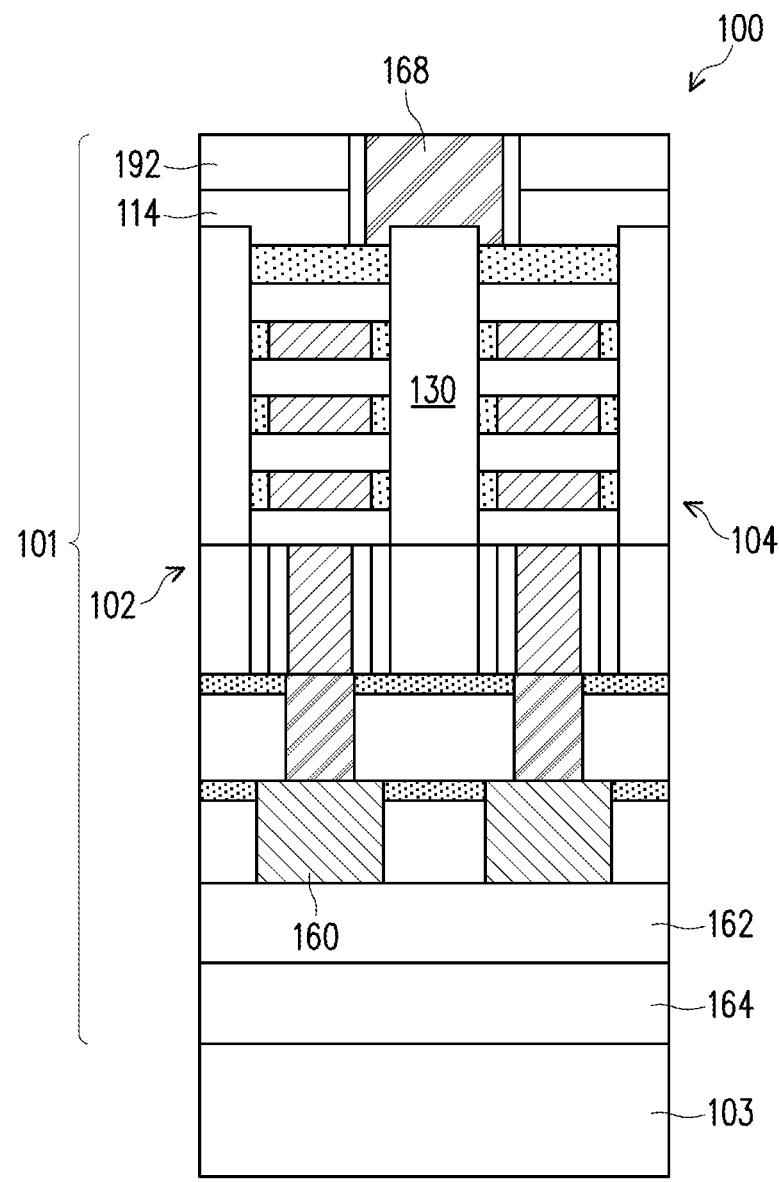

In FIG. 4C a trench has been formed in the insulator layer 192 and the second semiconductor layer 114. The bottom electrode 168 has been formed in the trench in direct contact with the joint source and drain layer 130. The bottom electrode 160 can be formed with substantially the same processes in the same materials described in relation to forming the bottom electrode 168 in FIG. 1J.

Figure 4D:
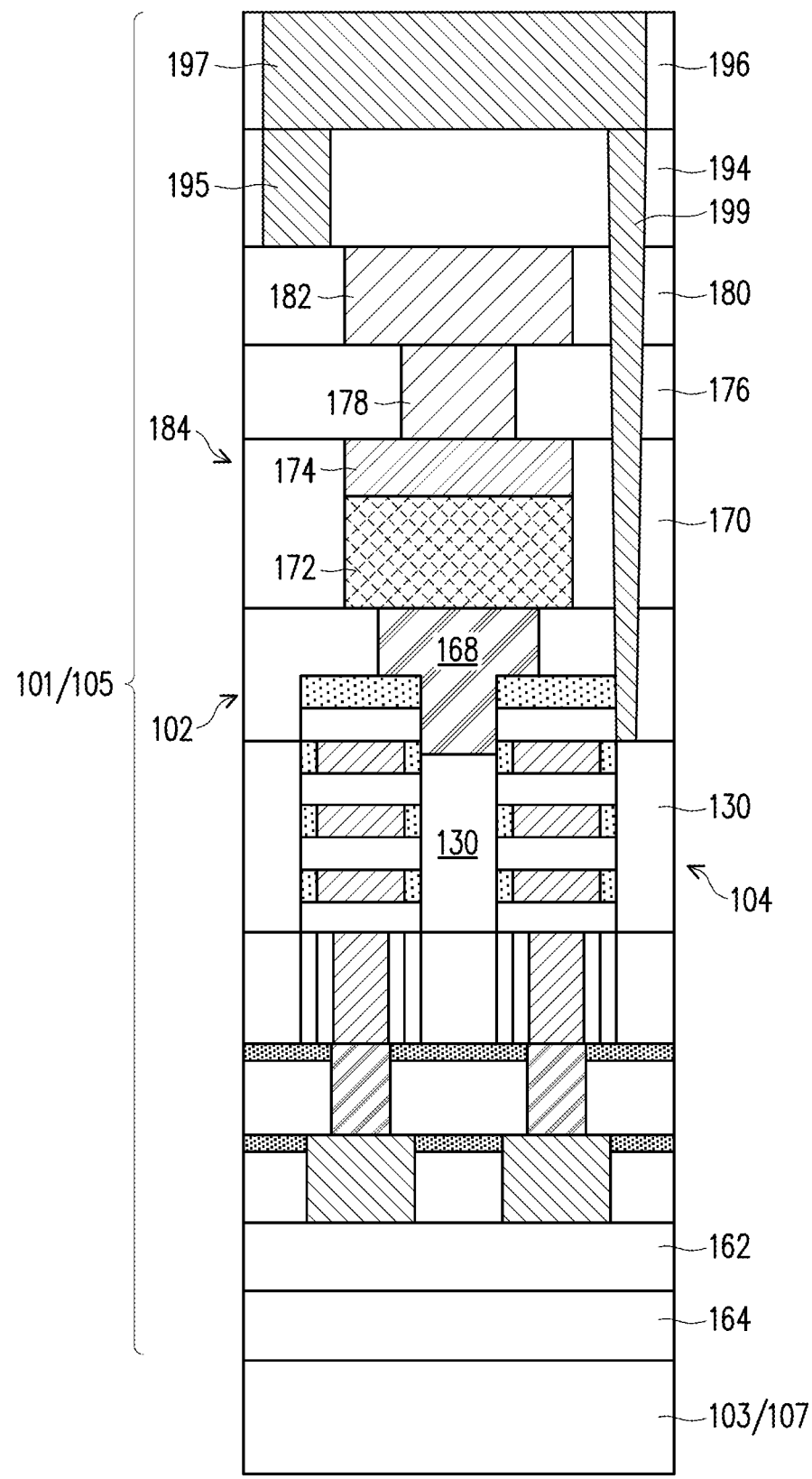

In FIG. 4D, the dielectric layers 170, 176, and 180 have been formed in a substantially similar manner as described in relation to FIG. 1K. The phase change memory element 172, the top electrode 174, the plug 178, and the metal line 182 have been formed in substantially the same manner as described in relation to FIG. 1K.

In FIG. 4D, additional dielectric layers 194 and 196 have been formed above the dielectric layer 180. The plug 195 has been formed in the dielectric layer 194. The plug 195 can include tungsten or another similar conductive material. The metal line 197 has been formed in the dielectric layer 196. The metal line 197 can include copper or another suitable material. I contact plug 199 has been formed to contact the source/drain region 130 of the transistor 104 that is opposite from the joint source drain region 130. Accordingly, the plug 194 and the metal line 197 represent metal interconnect structures and can be utilized for electrically connecting memory cells, transistors, or other circuit elements of the integrated circuit 100.

Figure 5A:
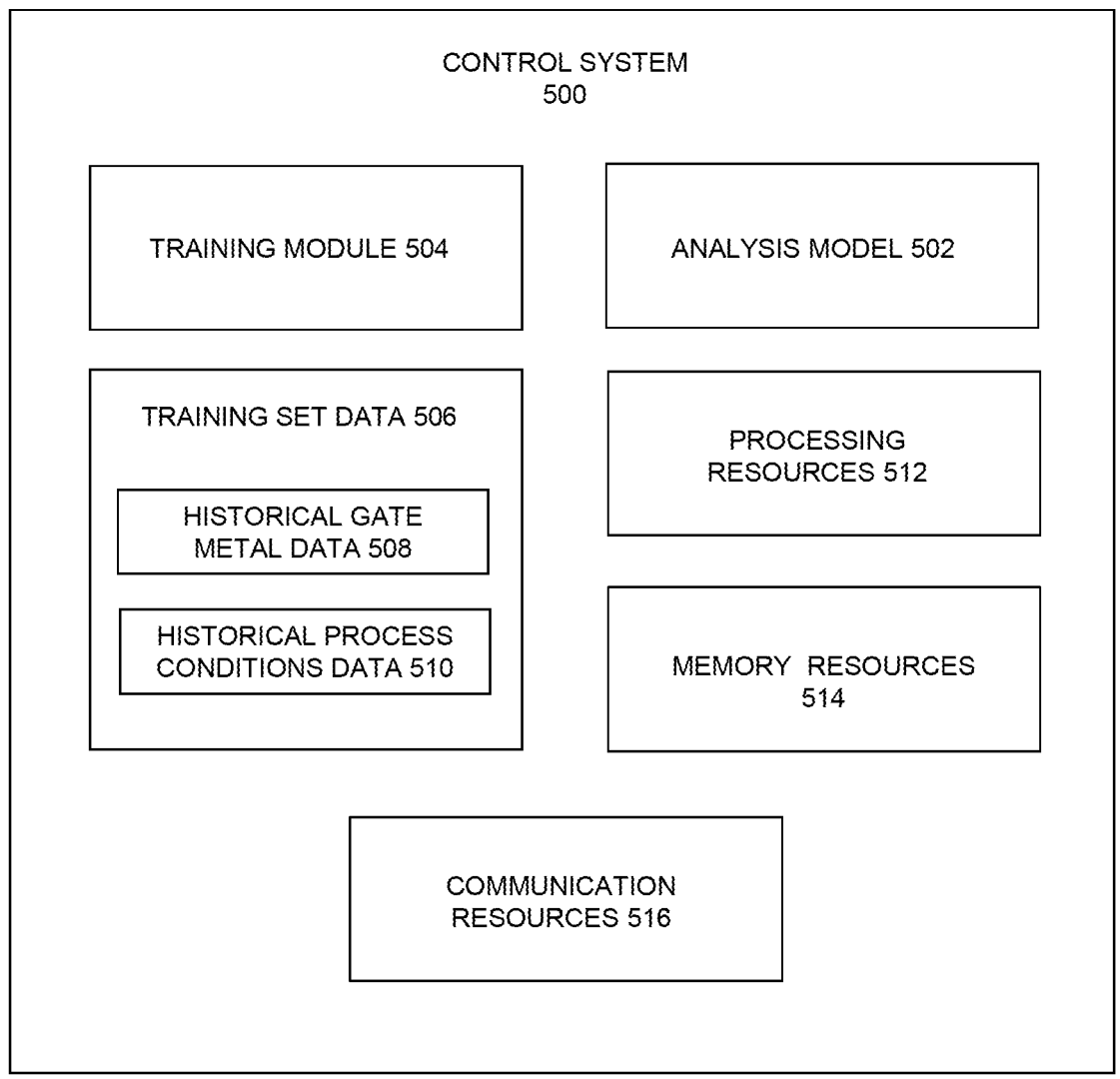
FIG. 5A is a block diagram of a control system of a semiconductor process system, according to some embodiments.

FIG. 5A is a block diagram of a control system 500 for controlling an atomic layer etching (ALE) process, according to some embodiments. The control system 500 of FIG. 5A is configured to control operation of an ALE etching system in performing ALE processes to form aspects of the integrated circuits 100 of FIGS. 1A-4D, according to some embodiments. In some embodiments, controls system 500 is utilized to control an ALE process for forming the metal layers of the gate electrode 148 of the transistor 102 as described in relation to FIG. 1B. In particular, the ALE process can be utilized for tightly controlling the thickness and the height of the metal layer 140 of the gate electrode 148, or other metal layers and the gate electrode 148.

Figure 5B:
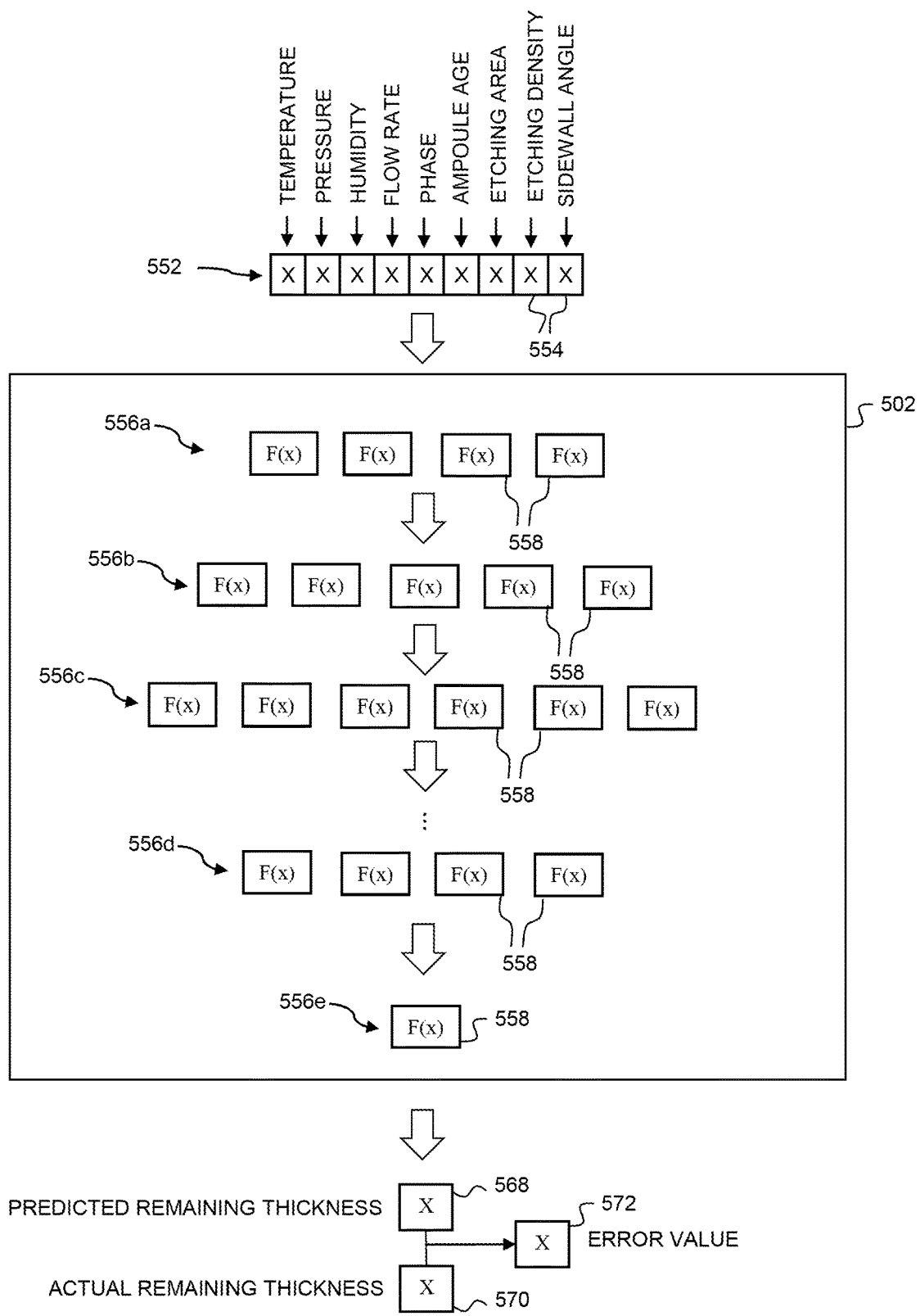
FIG. 5B is a block diagram of an analysis model, according to some embodiments.

While the description of FIGS. 5A and 5B is directed primarily to controlled etching of layers of the gate electrode 148, the controlled etching process can also be used to pattern other thin-films. For example, the controlled etching can be used to pattern the various gate dielectric layers or other layers associated with a PCRAM memory cell 184.

The control system 500 utilizes machine learning to adjust parameters of the ALE system. The control system 500 can adjust parameters of the ALE system between ALE runs or even between ALE cycles in order to ensure that the gate metal or gate metals of the gate electrode 148 fall within selected specifications.

In some embodiments, the control system 500 includes an analysis model 502 and a training module 504. The training module trains the analysis model 502 with a machine learning process. The machine learning process trains the analysis model 502 to select parameters for an ALE process that will result in the gate electrode of the transistor 102 having selected characteristics. Although the training module 504 is shown as being separate from the analysis model 502, in practice, the training module 504 may be part of the analysis model 502.

The control system 500 includes, or stores, training set data 506. The training set data 506 includes historical gate metal data 508 and historical process conditions data 510. The historical gate metal data 508 includes data related to gate electrodes resulting from ALE processes. The historical process conditions data 510 includes data related to process conditions during the ALE processes that etched the gate metals. As will be set forth in more detail below, the training module 504 utilizes the historical gate metal data 508 and the historical process conditions data 510 to train the analysis model 502 with a machine learning process.

In some embodiments, the historical gate metal data 508 includes data related to the remaining thickness of previously etched gate metals. For example, during operation of a semiconductor fabrication facility, thousands or millions of semiconductor wafers may be processed over the course of several months or years. Each of the semiconductor wafers may include gate metals etched by ALE processes. After each ALE process, the thicknesses of the thin-films are measured as part of a quality control process. The historical gate metal data 508 includes the remaining thicknesses of each of the gate metals etched by ALE processes. Accordingly, the historical gate metal data 508 can include thickness data for a large number of thin-films etched by ALE processes.

In some embodiments, the historical gate metal data 508 may also include data related to the thickness of gate metals at intermediate stages of the thin-film etching processes. For example, an ALE process may include a large number of etching cycles during which individual layers of the gate metal are etched. The historical gate metal data 508 can include thickness data for gate metals after individual etching cycles or groups of etching cycles. Thus, the historical gate metal data 508 not only includes data related to the total thickness of a gate metal after completion of an ALE process, but may also include data related to the thickness of the gate metal at various stages of the ALE process.

In some embodiments, the historical gate metal data 508 includes data related to the composition of the remaining gate metals etched by ALE processes. After a gate metal is etched, measurements can be made to determine the elemental or molecular composition of the gate metals. Successful etching of the gate metals results in a gate metal that includes particular remaining thicknesses. Unsuccessful etching processes may result in a gate metal that does not include the specified proportions of elements or compounds. The historical gate metal data 508 can include data from measurements indicating the elements or compounds that make up the various gate metals.

In some embodiments, the historical process conditions 510 include various process conditions or parameters during ALE processes that etch the gate metals associated with the historical gate metal data 508. Accordingly, for each gate metal having data in the historical gate metal data 508, the historical process conditions data 510 can include the process conditions or parameters that were present during etching of the gate metal. For example, the historical process conditions data 510 can include data related to the pressure, temperature, and fluid flow rates within the process chamber during ALE processes.

The historical process conditions data 510 can include data related to remaining amounts of precursor material in the fluid sources during ALE processes. The historical process conditions data 510 can include data related to the age of the ALE etching chamber, the number of etching processes that have been performed in the ALE etching chamber, a number of etching processes that have been performed in the ALE etching chamber since the most recent cleaning cycle of the ALE etching chamber, or other data related to the ALE etching chamber. The historical process conditions data 510 can include data related to compounds or fluids introduced into the ALE etching chamber during the etching process. The data related to the compounds can include types of compounds, phases of compounds (solid, gas, or liquid), mixtures of compounds, or other aspects related to compounds or fluids introduced into the ALE etching chamber. The historical process conditions data 510 can include data related to the humidity within the ALE etching chamber during ALE processes. The historical process conditions data 510 can include data related to light absorption, light adsorption, and light reflection related to the ALE etching chamber. The historical process conditions data 510 can include data related to the length of pipes, tubes, or conduits that carry compounds or fluids into the ALE etching chamber during ALE processes. The historical process conditions data 510 can include data related to the condition of carrier gases that carry compounds or fluids into the ALE etching chamber during ALE processes.

In some embodiments, historical process conditions data 510 can include process conditions for each of a plurality of individual cycles of a single ALE process. Accordingly, the historical process conditions data 510 can include process conditions data for a very large number of ALE cycles.

In some embodiments, the training set data 506 links the historical gate metal data 508 with the historical process conditions data 510. In other words, the thin-film thickness, material composition, or crystal structure associated with a gate metal in the historical gate metal data 508 is linked to the process conditions data associated with that etching process. As will be set forth in more detail below, the labeled training set data can be utilized in a machine learning process to train the analysis model 502 to predict semiconductor process conditions that will result in properly formed gate metals.

In some embodiments, the control system 524 includes processing resources 512, memory resources 514, and communication resources 516. The processing resources 512 can include one or more controllers or processors. The processing resources 512 are configured to execute software instructions, process data, make thin-film etching control decisions, perform signal processing, read data from memory, write data to memory, and to perform other processing operations. The processing resources 512 can include physical processing resources 512 located at a site or facility of the ALE system. The processing resources can include virtual processing resources 512 remote from the site ALE system or a facility at which the ALE system is located. The processing resources 512 can include cloud-based processing resources including processors and servers accessed via one or more cloud computing platforms.

In some embodiments, the memory resources 514 can include one or more computer readable memories. The memory resources 514 are configured to store software instructions associated with the function of the control system and its components, including, but not limited to, the analysis model 502. The memory resources 514 can store data associated with the function of the control system 500 and its components. The data can include the training set data 506, current process conditions data, and any other data associated with the operation of the control system 500 or any of its components. The memory resources 514 can include physical memory resources located at the site or facility of the ALE system. The memory resources can include virtual memory resources located remotely from site or facility of the ALE system. The memory resources 514 can include cloud-based memory resources accessed via one or more cloud computing platforms.

In some embodiments, the communication resources can include resources that enable the control system 500 to communicate with equipment associated with the ALE system. For example, the communication resources 516 can include wired and wireless communication resources that enable the control system 500 to receive the sensor data associated with the ALE system and to control equipment of the ALE system. The communication resources 516 can enable the control system 500 to control the flow of fluids or other material from the fluid sources 508 and 510 and from the purge sources 512 and 514. The communication resources 516 can enable the control system 500 to control heaters, voltage sources, valves, exhaust channels, wafer transfer equipment, and any other equipment associated with the ALE system. The communication resources 516 can enable the control system 500 to communicate with remote systems. The communication resources 516 can include, or can facilitate communication via, one or more networks such as wire networks, wireless networks, the Internet, or an intranet. The communication resources 516 can enable components of the control system 500 to communicate with each other.

In some embodiments, the analysis model 502 is implemented via the processing resources 512, the memory resources 514, and the communication resources 516. The control system 500 can be a dispersed control system with components and resources and locations remote from each other and from the ALE system.

FIG. 5B is a block diagram illustrating operational aspects and training aspects of the analysis model 502 of FIG. 5A, according to some embodiments. The analysis model 502 can be used to select parameters for ALE processes performed by the ALE system to form aspects the integrated circuits 100 of FIGS. 1A-4D. In some embodiments, the analysis model 502 of FIG. 5B is used to control an ALE process for forming individual gate metal layers of the gate electrode 148 described in relation to FIG. 1B.

While the description of the analysis model 502 is directed primarily to forming or patterning the gate metal, the analysis model 502 can be utilized to pattern other materials of the transistor 102 or the phase change memory element 172. For example, the analysis model 502 can control an ALE process for forming or patterning the metal layers associated with the gate electrode 148 and the top electrode 162.

As described previously, the training set data 506 includes data related to a plurality of previously performed gate metal etching processes. Each previously performed gate metal etching process took place with particular process conditions and resulted in a gate metal having a particular characteristics. The process conditions for each previously performed gate metal etching process are formatted into a respective process conditions vector 552. The process conditions vector includes a plurality of data fields 554. Each data field 554 corresponds to a particular process condition.

The example of FIG. 5B illustrates a single process conditions vector 552 that will be passed to the analysis model 502 during the training process. In the example of FIG. 5B, the process conditions vector 552 includes nine data fields 554. A first data field 554 corresponds to the temperature during the previously performed gate metal etching process. A second data field 556 corresponds to the pressure during the previously performed gate metal etching process. A third data field 554 corresponds to the humidity during the previously performed gate metal etching process. The fourth data field 554 corresponds to the flow rate of etching materials during the previously performed gate metal etching process. The fifth data field 554 corresponds to the phase (liquid, solid, or gas) of etching materials during the previously performed gate metal etching process. The sixth data field 554 corresponds to the age of the ampoule used in the previously performed gate metal etching process. The seventh data field 554 corresponds to a size of an etching area on a wafer during the previously performed gate metal etching process. The eighth data field 554 corresponds to the density of surface features of the wafer utilized during the previously performed gate metal etching process. The ninth data field corresponds to the angle of sidewalls of surface features during the previously performed gate metal etching process. In practice, each process conditions vector 552 can include more or fewer data fields than are shown in FIG. 5B without departing from the scope of the present disclosure. Each process conditions vector 552 can include different types of process conditions without departing from the scope of the present disclosure. The particular process conditions illustrated in FIG. 5B are given only by way of example. Each process condition is represented by a numerical value in the corresponding data field 554. For condition types that are not naturally represented in numbers, such as material phase, a number can be assigned to each possible phase.

The analysis model 502 includes a plurality of neural layers 556a-e. Each neural layer includes a plurality of nodes 558. Each node 558 can also be called a neuron. Each node 558 from the first neural layer 556a receives the data values for each data field from the process conditions vector 552. Accordingly, in the example of FIG. 5B, each node 558 from the first neural layer 556a receives nine data values because the process conditions vector 552 has nine data fields. Each neuron 558 includes a respective internal mathematical function labeled F(x) in FIG. 5B. Each node 558 of the first neural layer 556a generates a scalar value by applying the internal mathematical function F(x) to the data values from the data fields 554 of the process conditions vector 552. Further details regarding the internal mathematical functions F(x) are provided below.

Each node 558 of the second neural layer 556b receives the scalar values generated by each node 558 of the first neural layer 556a. Accordingly, in the example of FIG. 5B each node of the second neural layer 556b receives four scalar values because there are four nodes 558 in the first neural layer 556a. Each node 558 of the second neural layer 556b generates a scalar value by applying the respective internal mathematical function F(x) to the scalar values from the first neural layer 556a.

Each node 558 of the third neural layer 556c receives the scalar values generated by each node 558 of the second neural layer 556b. Accordingly, in the example of FIG. 5B each node of the third neural layer 556c receives five scalar values because there are five nodes 558 in the second neural layer 556b. Each node 558 of the third neural layer 556c generates a scalar value by applying the respective internal mathematical function F(x) to the scalar values from the nodes 558 of the second neural layer 556b.

Each node 558 of the neural layer 556d receives the scalar values generated by each node 558 of the previous neural layer (not shown). Each node 558 of the neural layer 556d generates a scalar value by applying the respective internal mathematical function F(x) to the scalar values from the nodes 558 of the second neural layer 556b.

The final neural layer includes only a single node 558. The final neural layer receives the scalar values generated by each node 558 of the previous neural layer 556d. The node 558 of the final neural layer 556e generates a data value 568 by applying a mathematical function F(x) to the scalar values received from the nodes 558 of the neural layer 556d.

In the example of FIG. 5B, the data value 568 corresponds to the predicted remaining thickness of a gate metal generated by process conditions data corresponding to values included in the process conditions vector 552. In other embodiments, the final neural layer 556e may generate multiple data values each corresponding to a particular gate metal characteristic such as gate metal crystal orientation, gate metal uniformity, or other characteristics of a gate metal. The final neural layer 556e will include a respective node 558 for each output data value to be generated. In the case of a predicted gate metal thickness, engineers can provide constraints that specify that the predicted gate metal thickness 568 must fall within a selected range, such as between 0 nm and 50 nm, in one example. The analysis model 502 will adjust internal functions F(x) to ensure that the data value 568 corresponding to the predicted gate metal thickness will fall within the specified range.

During the machine learning process, the analysis model compares the predicted remaining thickness in the data value 568 to the actual remaining thickness of the gate metal as indicated by the data value 570. As set forth previously, the training set data 506 includes, for each set of historical process conditions data, gate metal characteristics data indicating the characteristics of the gate metal that resulted from the historical gate metal etching process. Accordingly, the data field 570 includes the actual remaining thickness of the gate metal that resulted from the etching process reflected in the process conditions vector 552. The analysis model 502 compares the predicted remaining thickness from the data value 568 to the actual remaining thickness from the data value 570. The analysis model 502 generates an error value 572 indicating the error or difference between the predicted remaining thickness from the data value 568 and the actual remaining thickness from the data value 570. The error value 572 is utilized to train the analysis model 502.

The training of the analysis model 502 can be more fully understood by discussing the internal mathematical functions F(x). While all of the nodes 558 are labeled with an internal mathematical function F(x), the mathematical function F(x) of each node is unique. In one example, each internal mathematical function has the following form:

$$F(x) = x_1 * w_1 + x_2 * w_2 + \ldots x_n * w_1 + b.$$

In the equation above, each value $x_1$-$x_n$ corresponds to a data value received from a node 558 in the previous neural layer, or, in the case of the first neural layer 556a, each value $x_1$-$x_n$ corresponds to a respective data value from the data fields 554 of the process conditions vector 552. Accordingly, n for a given node is equal to the number of nodes in the previous neural layer. The values $w_1$-$w_n$ are scalar weighting values associated with a corresponding node from the previous layer. The analysis model 502 selects the values of the weighting values $w_1$-$w_n$. The constant b is a scalar biasing value and may also be multiplied by a weighting value. The value generated by a node 558 is based on the weighting values $w_1$-$w_n$. Accordingly, each node 558 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 572 has been calculated, the analysis model 502 adjusts the weighting values $w_1$-$w_n$ for the various nodes 558 of the various neural layers 556a-556e. After the analysis model 502 adjusts the weighting values $w_1$-$w_n$, the analysis model 502 again provides the process conditions vector 552 to the input neural layer 556a. Because the weighting values are different for the various nodes 558 of the analysis model 502, the predicted remaining thickness 568 will be different than in the previous iteration. The analysis model 502 again generates an error value 572 by comparing the actual remaining thickness 570 to the predicted remaining thickness 568.

The analysis model 502 again adjusts the weighting values $w_1$-$w_n$ associated with the various nodes 558. The analysis model 502 again processes the process conditions vector 552 and generates a predicted remaining thickness 568 and associated error value 572. The training process includes adjusting the weighting values $w_1$-$w_n$ in iterations until the error value 572 is minimized.

FIG. 5B illustrates a single process conditions vector 552 being passed to the analysis model 502. In practice, the training process includes passing a large number of process conditions vectors 552 through the analysis model 502, generating a predicted remaining thickness 568 for each process conditions vector 552, and generating associated error value 572 for each predicted remaining thickness. The training process can also include generating an aggregated error value indicating the average error for all the predicted remaining thicknesses for a batch of process conditions vectors 552. The analysis model 502 adjusts the weighting values $w_1$-$w_n$ after processing each batch of process conditions vectors 552. The training process continues until the average error across all process conditions vectors 552 is less than a selected threshold tolerance. When the average error is less than the selected threshold tolerance, the analysis model 502 training is complete and the analysis model is trained to accurately predict the thickness of gate metals based on the process conditions. The analysis model 502 can then be used to predict gate metal thicknesses and to select process conditions that will result in a desired gate metal thickness. During use of the trained model 502, a process conditions vector, representing current process condition for a current gate metal etching process to be performed, and having the same format at the process conditions vector 552, is provided to the trained analysis model 502. The trained analysis model 502 can then predict the thickness of a gate metal that will result from those process conditions.

A particular example of a neural network based analysis model 502 has been described in relation to FIG. 5B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 6:
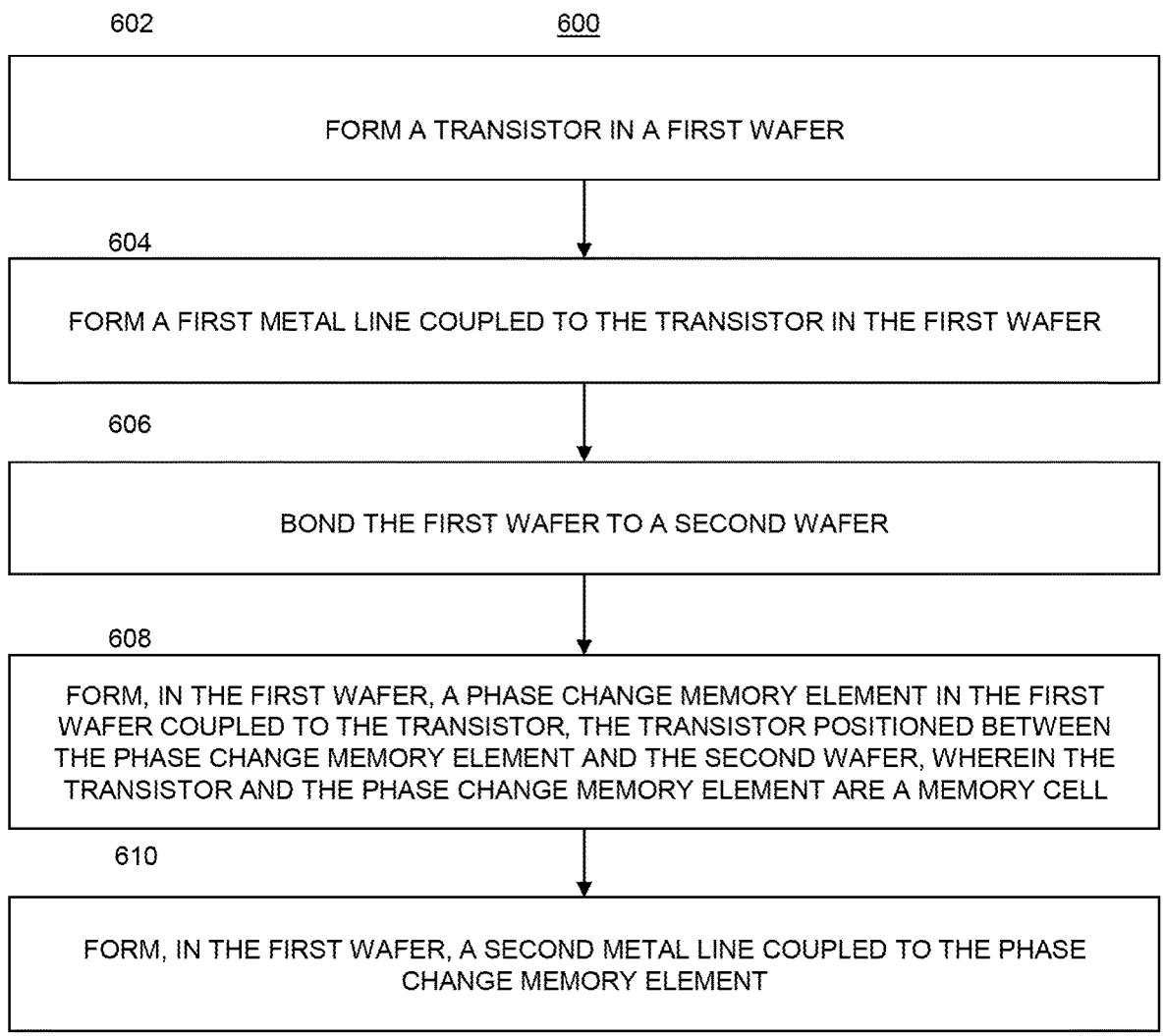
FIG. 6 is a flow diagram of a method for operating an electronic device, according to some embodiments.

FIG. 6 is a flow diagram of a method 600 for operating an electronic device, according to one embodiment. The method 600 can be utilized in conjunction with devices, systems, components, and processes associated with FIGS. 1A-5B. At 602, the method 600 includes forming a transistor in the first wafer. One example of a transistor is the transistor 102 of FIG. 1B. One example of a first wafer is the first wafer 101 of FIG. 1B. At 604, the method 600 includes forming a first metal line coupled to the transistor in the first wafer. One example of a first metal line is the metal line 160 of FIG. 1C. At 606, the method 600 includes bonding the first wafer to a second wafer. One example of a second wafer is the second wafer 103 of FIG. 1E. At 608, the method 600 includes forming, in the first wafer, a phase change memory element coupled to the transistor. The transistor is positioned between the phase change memory element and the second wafer. The transistor and the phase change memory element are a memory cell. One example of a phase change memory element is the phase change memory element 172 of FIG. 1K. One example of a memory cell is the memory cell 184 of FIG. 1K. At 610, the method 600 includes forming, in the first wafer, a second metal line coupled to the phase change memory element. One example of a second metal line is the metal line 182 of FIG. 1K.

In one embodiment, an integrated circuit includes a first chip including a memory cell. The memory cell includes a transistor and a phase change memory element electrically coupled to the transistor. The integrated circuit includes a second chip bonded to the first chip, wherein the transistor is positioned between the phase change memory element and the second chip.

In one embodiment, a method includes forming a transistor in a first wafer, forming a first metal line coupled to the transistor in the first wafer, bonding the first wafer to a second wafer, and forming, in the first wafer, a phase change memory element coupled to the transistor. The transistor is positioned between the phase change memory element and the second wafer. The transistor and the phase change memory element are a memory cell. The method includes forming, in the first wafer, a second metal line coupled to the phase change memory element.

In one embodiment, an integrated circuit includes a first chip including an array of memory cells. Each memory cell includes a gate all around transistor including, a plurality of semiconductor nanosheets, a gate electrode surrounding the semiconductor nanosheets, a source terminal in contact with the semiconductor nanosheets and a drain terminal in contact with the semiconductor nanosheets. Each memory cell includes a phase change memory element coupled to the either the source terminal or the drain terminal. The integrated circuit includes a second chip bonded to the first chip.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
    a first chip including a memory cell, the memory cell including:
        a transistor including:
            a plurality of semiconductor nanosheets;
            a gate dielectric surrounding the semiconductor nanosheets;
            a gate electrode including a gate metal surrounding the semiconductor nanosheets and separated from the semiconductor nanosheets by the gate dielectric;
            a first semiconductor source/drain terminal coupled to the semiconductor nanosheets; and
            a second semiconductor source/drain terminal coupled to the semiconductor nanosheets;
        a phase change memory element electrically coupled to the transistor; and
        a first electrode coupled between the phase change memory element and the transistor and having a top surface coupled to a bottom surface of the first semiconductor source/drain terminal; and
    a second chip bonded to the first chip, wherein the transistor is positioned between the phase change memory element and the second chip.

2. The device of claim 1, wherein the memory cell includes a second electrode coupled to the phase change memory element, the phase change memory element positioned between the first electrode and the second electrode.

3. The device of claim 2, wherein the first chip further includes:

a first metal line coupled to the second electrode and positioned on a first side of the first chip distal to the second chip; and a second metal line coupled to the gate electrode and positioned on a second side of the first chip proximal to the second chip.

4. The device of claim 3, wherein the first metal line is one of a first bitline or a first wordline coupled to the memory cell, and wherein the second metal line is either a second wordline or a second bitline coupled to the memory cell.

5. The device of claim 1, wherein the first electrode is in contact with one of the semiconductor nanosheets.

6. The device of claim 1, wherein the phase change material includes GeSbTe.

7. The device of claim 1, wherein the phase change memory element is a data storage element of the memory cell.

8. The device of claim 1, wherein the first electrode is a heater element configured to heat the phase change memory element to write or erase data from the phase change element.

9. A device, comprising
a first chip;
a second chip bonded to the first chip and including a semiconductor material;
a transistor in the first chip including:
  a first semiconductor source/drain terminal;
  a second semiconductor source/drain terminal;
  a channel region extending laterally between the source terminal and the drain terminal; and
  a gate electrode above the channel region and below the second chip;
a first metal line in the first chip between the transistor and the second chip and coupled to the transistor;
a phase change memory element in the first chip below the channel region and coupled to the transistor, the transistor positioned between the phase change memory element and the second chip, wherein the transistor and the phase change memory element are a memory cell;
a first electrode coupled between the phase change memory element and the transistor and having a top surface coupled to a bottom surface of the first semiconductor source/drain terminal; and
a second metal line in the first chip below the phase change memory cell and coupled to the phase change memory element.

10. The device of claim 9, further comprising a semiconductor nanosheet below the channel, wherein the first electrode is in contact with the phase change memory element and the semiconductor nanosheet.

11. The device of claim 10, further comprising a second electrode in contact with the phase change memory element and the second metal line.

12. The device of claim 10, wherein the first chip is silicon-on-insulator chip.

13. The device of claim 10, wherein the phase change material includes GeSbTe.

14. The device of claim 10, wherein the phase change memory element is a data storage element of the memory cell.

15. The device of claim 10, wherein the first electrode is a heater element configured to heat the phase change memory element to write or erase data from the phase change element.

16. The device of claim 9, wherein the gate electrode is wrapped around the channel region.

17. A device, comprising:
a first chip including an array of memory cells, each memory cell including:
  a transistor including:
    a channel region;
    a gate electrode above the channel region;
    a first semiconductor source/drain terminal in contact with the channel region; and
    a second semiconductor source/drain terminal in contact with the channel region, the channel region extending laterally between the source terminal and the drain terminal;
  a phase change memory element below the channel region and coupled to either the source terminal or the drain terminal;
  an electrode coupled between the phase change memory element and the transistor and having a top surface coupled to a bottom surface of the first semiconductor source/drain terminal; and
a second chip bonded to the first chip above the channel region and including a semiconductor material.

18. The device of claim 17, comprising a semiconductor nanosheet below the channel region, wherein the electrode is in contact with the phase change memory element and the semiconductor nanosheet.

19. The device of claim 18, wherein a side surface of the electrode is in contact with the semiconductor nanosheet.

20. The device of claim 17, wherein the gate electrode is wrapped around the channel region.

* * * * *